US007560325B1

(12) United States Patent
Merrett et al.

(10) Patent No.: US 7,560,325 B1
(45) Date of Patent: Jul. 14, 2009

(54) METHODS OF MAKING LATERAL JUNCTION FIELD EFFECT TRANSISTORS USING SELECTIVE EPITAXIAL GROWTH

(75) Inventors: Joseph Neil Merrett, Starkville, MS (US); Igor Sankin, Starkville, MS (US)

(73) Assignee: SemiSouth Laboratories, Inc., Starkville, MI (US)

( * ) Notice: Subject to any disclaimer, the term of this patent is extended or adjusted under 35 U.S.C. 154(b) by 0 days.

(21) Appl. No.: 12/102,382

(22) Filed: Apr. 14, 2008

(51) Int. Cl.
*H01L 21/337* (2006.01)
*H01L 29/80* (2006.01)

(52) U.S. Cl. ...................................... 438/191; 257/259

(58) Field of Classification Search ......... 438/191-194, 438/162, 229; 257/259-264
See application file for complete search history.

(56) References Cited

U.S. PATENT DOCUMENTS 6,767,783 B2 * 7/2004 Casady et al. ............... 438/234
2006/0211210 A1 * 9/2006 Bhat et al. .................. 438/377

OTHER PUBLICATIONS

Li, et al., "Selective growth of 4H-SiC on 4H-SiC substrates using a high temperature mask," Materials Science Forum, vols. 457-460, pp. 185-188 (2004).
Li, et al., "Fabrication and characterization of 4H-SiC P-N junction diodes by selective-epitaxial growth using TaC as the mask," Journal of Electronic Materials, vol. 34, No. 4, pp. 450-456 (2005).

* cited by examiner

*Primary Examiner*—Calvin Lee
(74) *Attorney, Agent, or Firm*—Morris, Manning & Martin, LLP; Christopher W. Raimund

(57) ABSTRACT

Methods of making a semiconductor device such as a lateral junction field effect transistor (JFET) are described. The methods are self-aligned and involve selective epitaxial growth using a regrowth mask material to form the gate or the source/drain regions of the device. The methods can eliminate the need for ion implantation. The device can be made from a wide band-gap semiconductor material such as SiC. The regrowth mask material can be TaC. The devices can be used in harsh environments including applications involving exposure to radiation and/or high temperatures.

29 Claims, 30 Drawing Sheets

METHODS OF MAKING LATERAL JUNCTION FIELD EFFECT TRANSISTORS USING SELECTIVE EPITAXIAL GROWTH

STATEMENT REGARDING FEDERALLY SPONSORED REASEARCH

This invention was made with U.S. Government support under Contract No. FA8650-04-C-5435, awarded by the U.S. Air Force. The U.S. Government may have certain rights in this invention.

BACKGROUND

1. Field

This application relates generally to methods of making semiconductor devices.

2. Background of the Technology

Semiconductor devices such as MOSFETs and JFETs are typically made using an ion implantation technique. MOSFETs, however, can have reliability and performance problems associated with the oxide gate layer. Unlike MOSFETs, ion implanted JFET devices can be made using a self-aligned process and can be designed such that they do not suffer oxide interface problems. However, ion implantation leaves residual damage that can affect device performance. In addition, p-type implanted layers are more resistive than epitaxially grown p-type layers in SiC. Implantation can also result in non-abrupt p-n junctions that can make the precise determination of critical device parameters difficult to ascertain.

Accordingly, there still exists a need for improved methods of making semiconductor devices such as JFETs that do not involve ion implantation.

SUMMARY

A method is provided which comprises:

selectively etching a first layer of semiconductor material through one or more openings in a first mask to form first and second discrete raised regions of semiconductor material having upper surfaces covered by the first mask, wherein the first layer of semiconductor material is on a second layer of semiconductor material which is on a third layer of semiconductor material which is on a semiconductor substrate, wherein the first and second layers of semiconductor material are of a first conductivity type, wherein the third layer of semiconductor material is of a second conductivity type different than the first conductivity type, wherein etching exposes the second layer of semiconductor material in regions adjacent and between the first and second discrete raised regions, and wherein the first mask comprises a layer of regrowth mask material on the first semiconductor layer and a layer of etch mask material on the layer of regrowth mask material, depositing a second mask on the second layer of semiconductor material in an area between the first and second discrete raised regions;

etching through the second layer of semiconductor material and the third layer of semiconductor material to expose the substrate in areas adjacent the first and second masks;

removing the second mask such that the area between the discrete raised regions is exposed;

removing the layer of etch mask material such that the upper surfaces of the discrete raised regions are covered by the regrowth mask material;

epitaxially growing one or more layers of semiconductor material of the second conductivity type on the area between the first and second discrete raised regions and on the substrate adjacent the first and second discrete raised regions;

removing the regrowth mask material;

depositing a third mask on the first and second discrete raised regions, on the area between the first and second discrete raised regions and on a gate region on the one or more layers of semiconductor material of the second conductivity type adjacent the first and second discrete raised regions;

etching through the one or more layers of semiconductor material of the second conductivity type in areas adjacent the third mask; and removing the third mask.

Also provided is a semiconductor device made by a method as set forth above.

A method is also provided which comprises:

selectively etching a layer of regrowth mask material through one or more openings in a first mask to form a discrete raised region of semiconductor material having an upper surface and sidewalls, wherein the layer of regrowth mask material is on a first layer of semiconductor material which is on a second layer of semiconductor material which is on a third layer of semiconductor material which is on a substrate, wherein the second layer of semiconductor material is of a first conductivity type and wherein the first and third layers of semiconductor material are of a second conductivity type different than the first conductivity type, and wherein etching comprises etching through the layer of regrowth mask material and the first layer of semiconductor material to expose underlying second layer of semiconductor material in regions adjacent the first mask;

removing the first mask such that the upper surface of the discrete raised region is covered by the regrowth mask material;

epitaxially growing one or more layers of semiconductor material of the first conductivity type on sidewalls of the discrete raised region and on the second layer of semiconductor material adjacent the discrete raised region; and removing the regrowth mask material from the upper surface of the discrete raised region.

Also provided is a semiconductor device made by a method as set forth above.

These and other features of the present teachings are set forth herein.

BRIEF DESCRIPTION OF THE DRAWINGS

The skilled artisan will understand that the drawings, described below, are for illustration purposes only. The drawings are not intended to limit the scope of the present teachings in any way.

DESCRIPTION OF THE VARIOUS EMBODIMENTS

Figure 1:
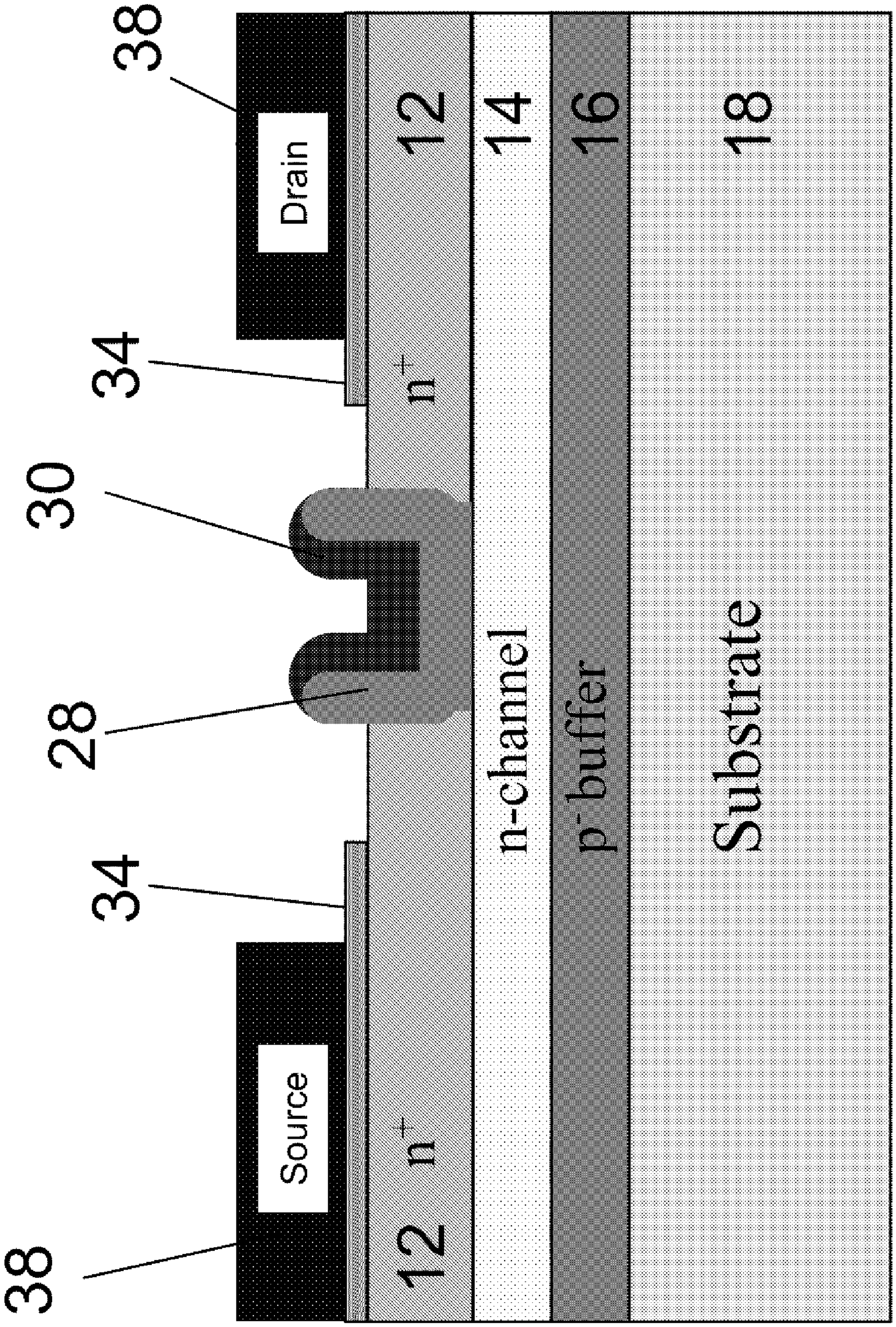
FIG. 1 is a schematic cross-section of a lateral JFET device having a selectively grown p-type gate region.

For the purposes of interpreting this specification, the use of "or" herein means "and/or" unless stated otherwise or where the use of "and/or" is clearly inappropriate. The use of "a" herein means "one or more" unless stated otherwise or where the use of "one or more" is clearly inappropriate. The use of "comprise," "comprises," "comprising," "include," "includes," and "including" are interchangeable and not intended to be limiting. Furthermore, where the description of one or more embodiments uses the term "comprising," those skilled in the art would understand that, in some specific instances, the embodiment or embodiments can be alternatively described using the language "consisting essentially of" and/or "consisting of." It should also be understood that in some embodiments the order of steps or order for performing certain actions is immaterial so long as the present teachings remain operable. Moreover, in some embodiments two or more steps or actions can be conducted simultaneously.

Methods of making a semiconductor device such as a lateral junction field effect transistor (JFET) are described. The methods include selective epitaxial through opening in a regrowth mask material to form the gate or the source/drain regions of the device. The device can be made from a wide band-gap semiconductor material such as SiC. The regrowth mask material can be TaC.

The methods described herein can eliminate the need for ion implantation which can result in residual damage that can affect device performance. In addition, devices made using ion implantation can have gradual or non-abrupt p-n junctions. Unlike devices made using ion implantation, integrated circuits with all epitaxial layers have abrupt p-n junctions. In the methods described herein, the same mask is used to define the gate and the source/drain regions of the device. This self-aligned process thereby allowing for the precise control of device dimensions without the need for critical realignment steps.

Following is a description of methods of fabricating lateral junction field effect transistors (JFETs) from a wide-bandgap semiconductor material such as SiC for the purpose of making integrated circuits. The methods described herein utilize the selective epitaxial regrowth of semiconductor material using a regrowth mask (e.g., a TaC mask) to isolate epitaxial growth to specific regions. Selective epitaxial regrowth can be used to form either the gate or source/drain layers of the device. The methods described herein can eliminate the need for ion implantation.

According to some embodiments, a selective regrowth technique can be used to form the $p^+$ gate regions of a transistor. In this device, the $n^+$ source/drain layer is grown on top of the channel layer, selectively etched back down to the channel layer to form the source/drain regions, and the p-type gate layer is then grown. This all-epitaxial approach utilizes a self-aligned selective regrowth technique using a mask (e.g., TaC) to prevent regrowth of p-type material on the source/drain regions.

A schematic cross-section of a lateral JFET having a selectively grown gate is shown in FIG. 1. As shown in FIG. 1, the device comprises raised $n^+$ regions 12 formed on an $n^-$ layer 14 which is formed on a $p^-$ layer 16 which is formed on a substrate 18. As shown in FIG. 1, the device also comprises a p-type gate region comprising a $p^-$ layer 28 and a $p^+$ layer 30 between the raised $n^+$ regions. Although two p-type layers are shown in FIG. 1, the device can also be made using a single p-type layer. As also shown in FIG. 1, ohmic contacts 34 are formed on the $n^+$ regions and final metal layers 38 are formed on the ohmic contacts 34 to form the source and drain contacts.

Figure 2A:
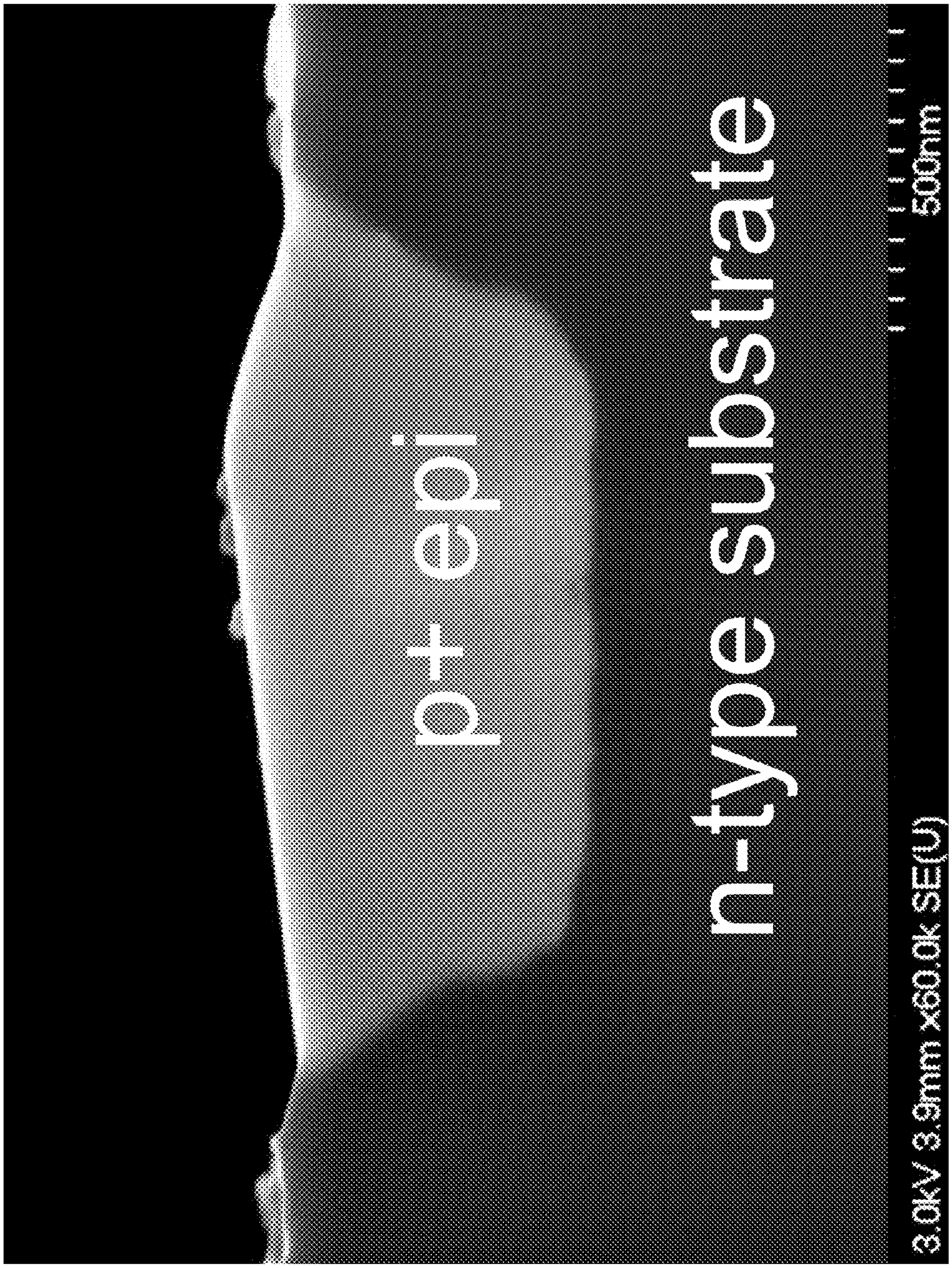
FIGS. 2A and 2B are cross sectional SEM images of epitaxial regrowth of p-type material in trenches formed in an n-type substrate perpendicular to the major flat (FIG. 2A) [i.e., in the (1100) direction] and parallel to the major flat (FIG. 2B) [i.e., in the (1120) directions].
Figure 2B:
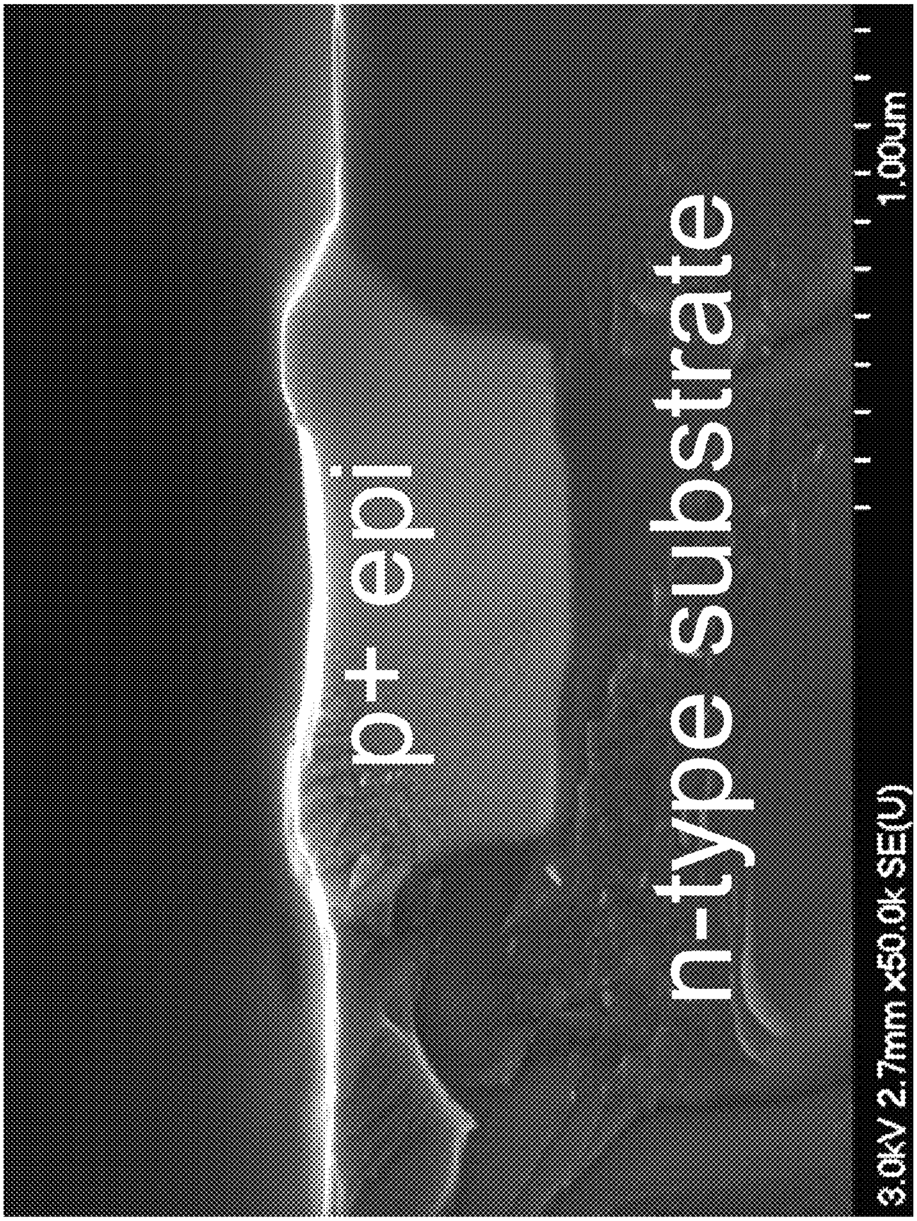

Selective regrowth using a TaC mask has been demonstrated by Li et al., "Selective Growth of 4H—SiC on 4H—SiC Substrates Using a High Temperature Mask," Materials Science Forum Vols. 457-460 (2004) pp. 185-188. A variation of the published technique was developed using a TaC mask formed by depositing a tantalum layer on a carbon layer and then annealing in a vacuum to react the two layers. Selective regrowth was successfully accomplished using this technique on an $n^+$ substrate with no buffer or channel layers. SEM cross-sections of selectively grown p-type SiC on an $n^+$ substrate are shown in FIGS. 2A and 2B for gate widths perpendicular to the major flat (FIG. 2A) [i.e., in the (1100) direction] and parallel to the major flat (FIG. 2B) [i.e., in the (1120) directions].

Figure 3A:
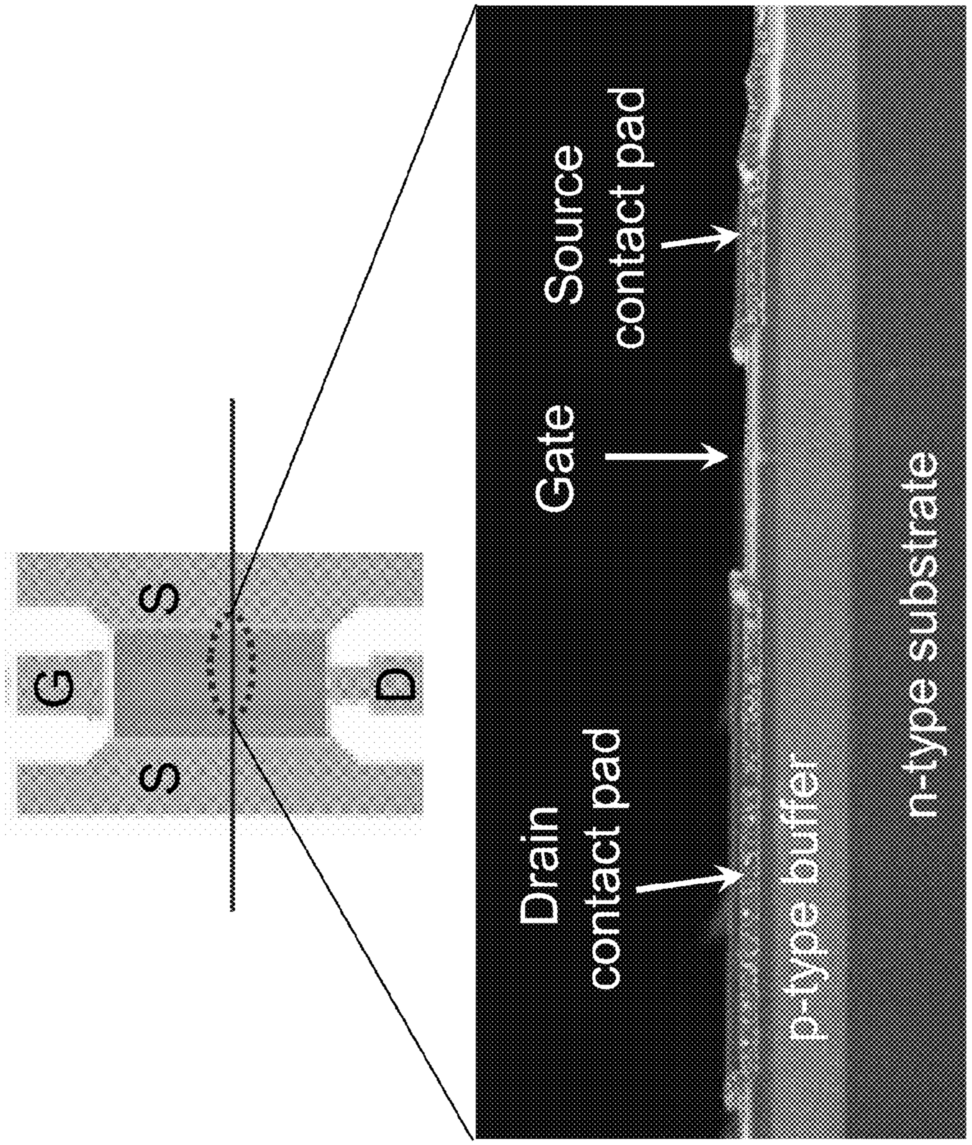
FIG. 3A is a schematic diagram of the layout of an LJFET device including an SEM image of a cross-section of the device.
Figure 3B:
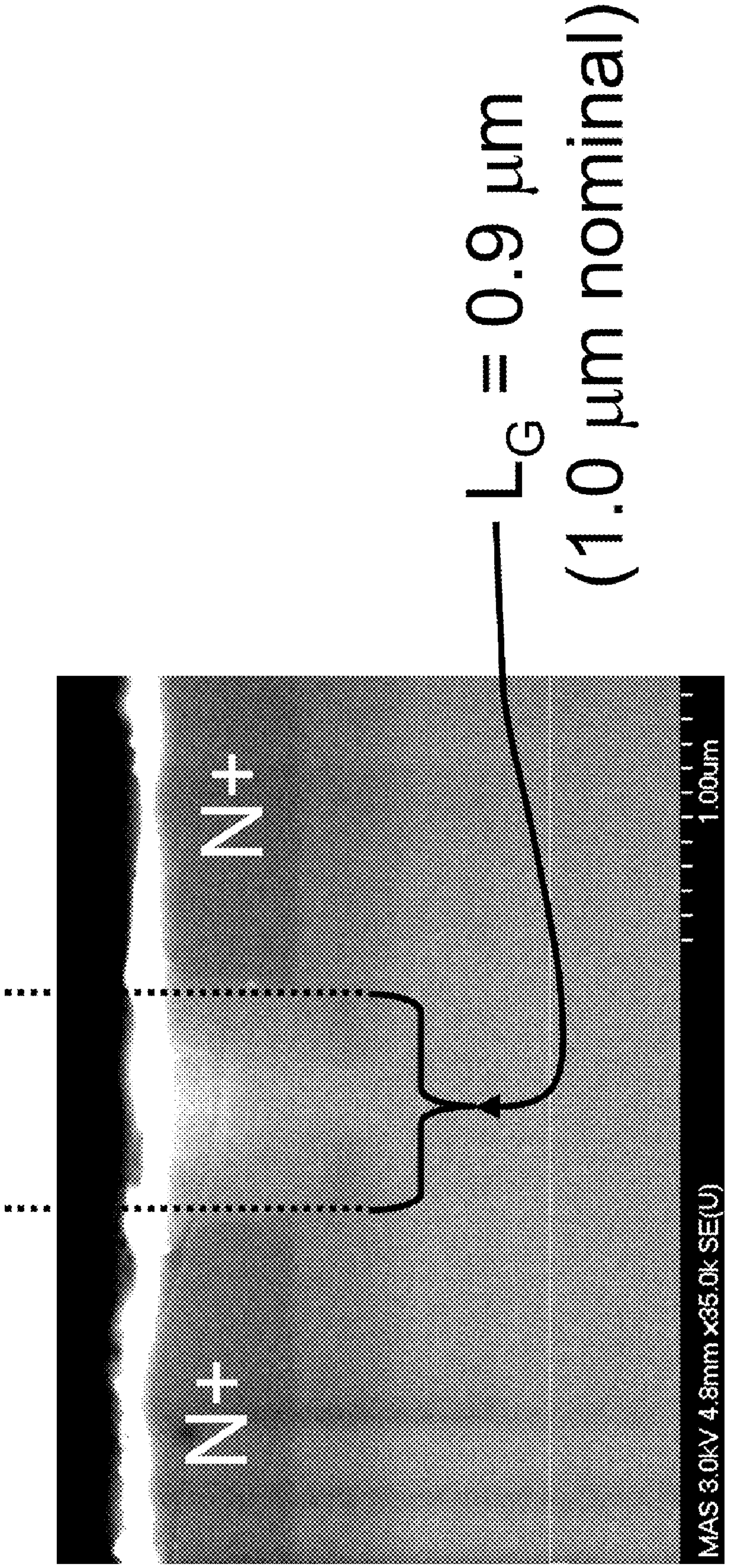
FIG. 3B is an SEM cross-sectional image of a device having a regrown p-type gate showing the regrown p-type gate between the n source and drain contact regions wherein the length of the gate ($L_G$) is 0.9 μm.

The aforementioned technique was used to fabricate devices having regrown p-type gates. A schematic of such a device is depicted in FIG. 3A which is a schematic diagram of the layout of an LJFET device including an SEM image of a cross-section of the device. FIG. 3B is an SEM cross-sectional image of a device having a regrown p-type gate showing the regrown p-type gate between the $n^+$ source and drain contact regions wherein the length of the gate ($L_G$) is 0.9 μm.

Figure 4:
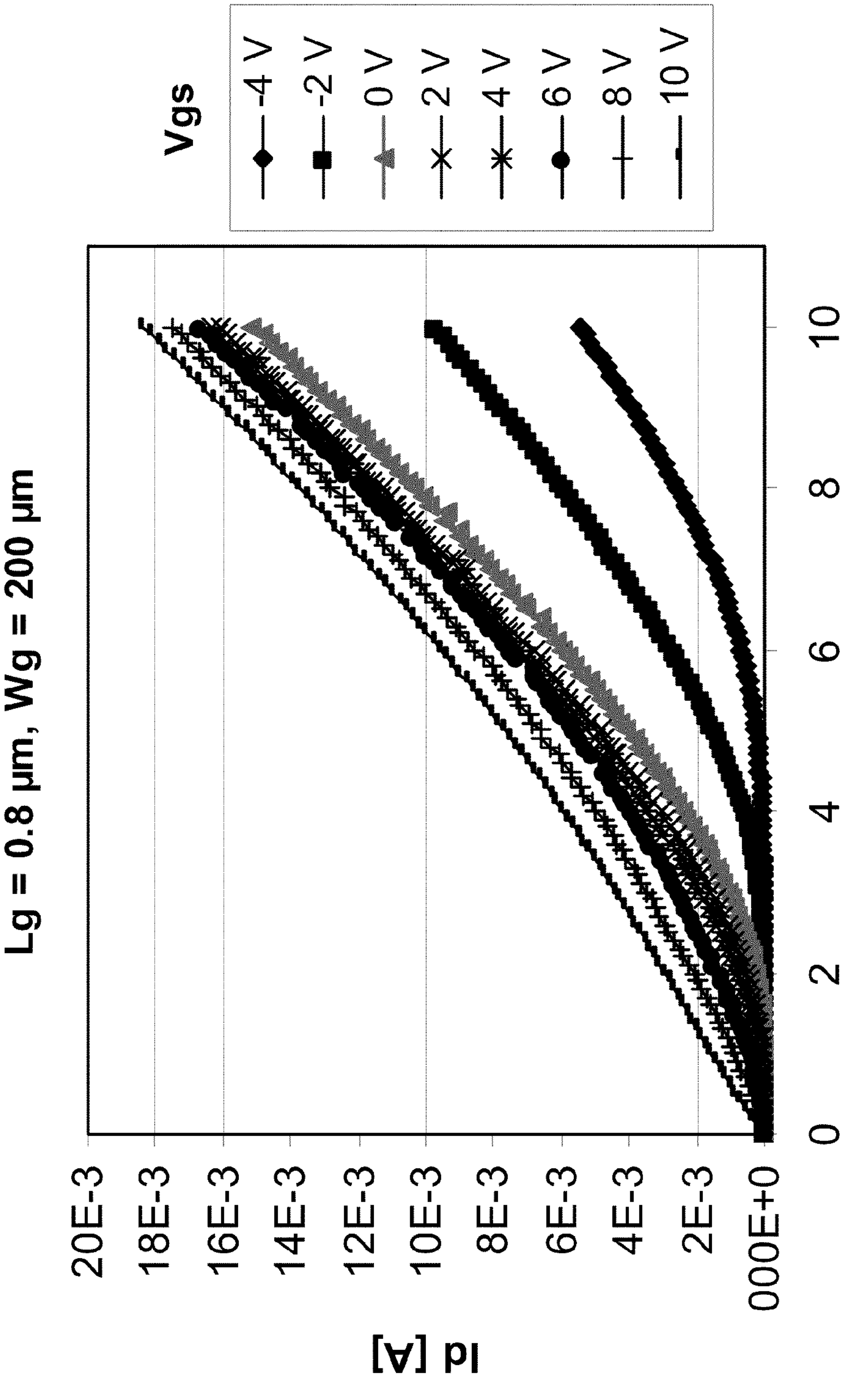
FIG. 4 is a graph of drain current (Id) as a function o drain-to-source voltage (Vds) at 8 different values of gate-to-source voltage (Vgs) for a lateral JFET device made using an all epitaxial manufacturing process and having a gate length ($L_G$) of 0.8 μm and a gate width ($W_G$) of 200 μm.

FIG. 4 is a graph of drain current (Id) as a function of drain-to-source voltage (Vds) at 8 different values of gate-to-source voltage (Vgs) for a lateral JFET device made using an all epitaxial manufacturing process and having a gate length ($L_G$) of 0.8 μm and a gate width ($W_G$) of 200 μm.

Figure 5:
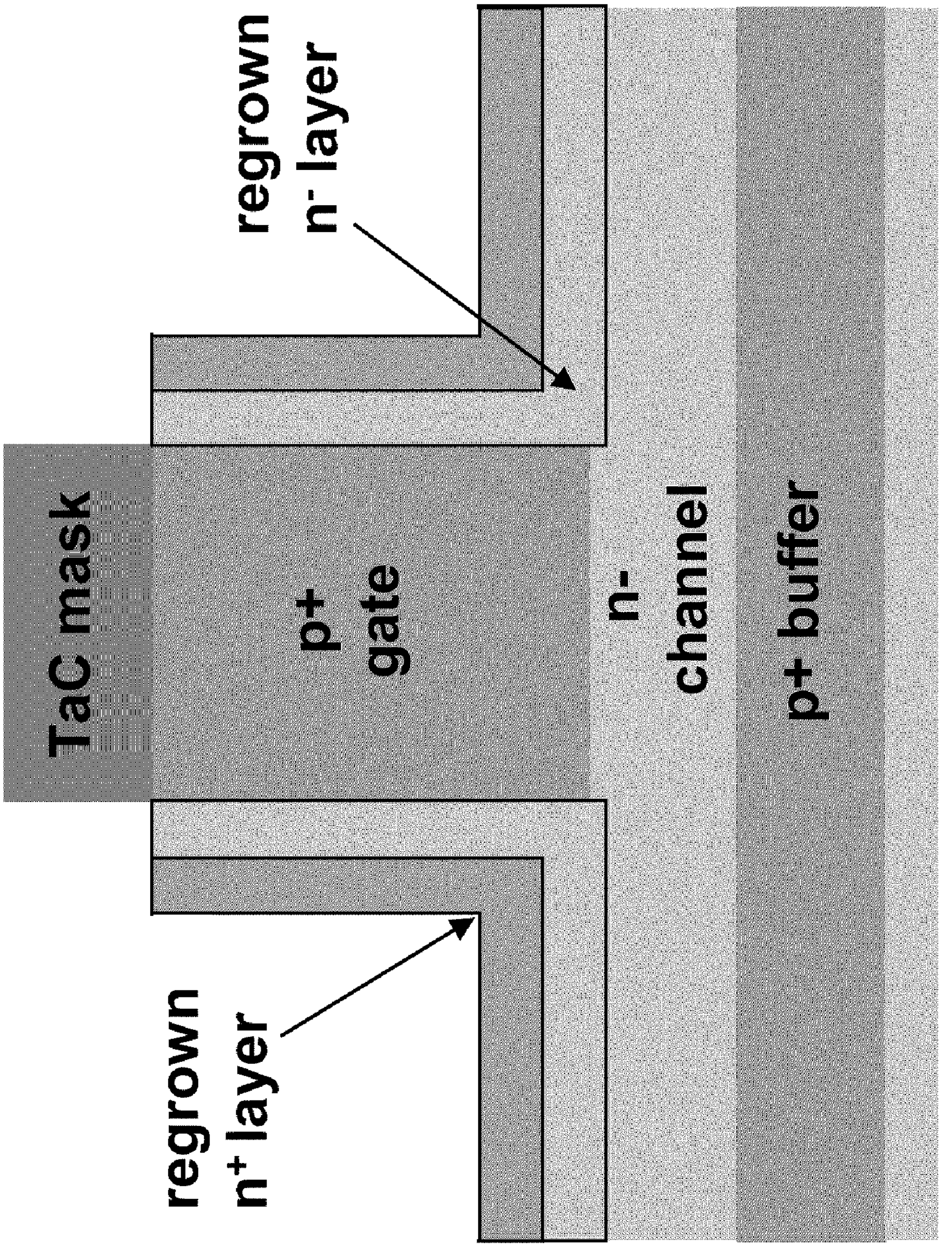
FIG. 5 is a schematic cross-sectional diagram of a JFET device made via selective regrowth of the source/drain regions.

According to some embodiments, a selective regrowth technique can be used to form the source/drain regions of a device. FIG. 5 is a schematic cross-sectional illustration of the epitaxial layers of a device with selectively grown source/drain regions. The use of selective regrowth of the drain/source regions can reduce or eliminate the effects of interface traps in the device.

A device having regrown source/drain regions can be made by growing a p-type gate layer on top of a channel layer, depositing a layer of regrowth mask material (e.g., TaC), patterning a dry etch mask material on the layer of regrowth mask material, dry etching through the regrowth mask layer and the underlying p-type SiC gate layer down to the channel layer, removing the etch mask, and then regrowing an $n^+$ source/drain layer over the exposed channel layer and on the sidewalls of the $p^+$ gate epitaxial layer. To enhance performance of the device, an $n^-$ layer and an $n^+$ layer could be regrown on the exposed channel layer and on the sidewalls of the $p^+$ gate epitaxial layer. The $n^-$ layer can provide a drift region between the $n^+$ and $p^+$ material so that sufficient blocking voltage can be achieved. In this way, the channel can be shielded from interface traps without sacrificing blocking voltage.

Figure 6A:
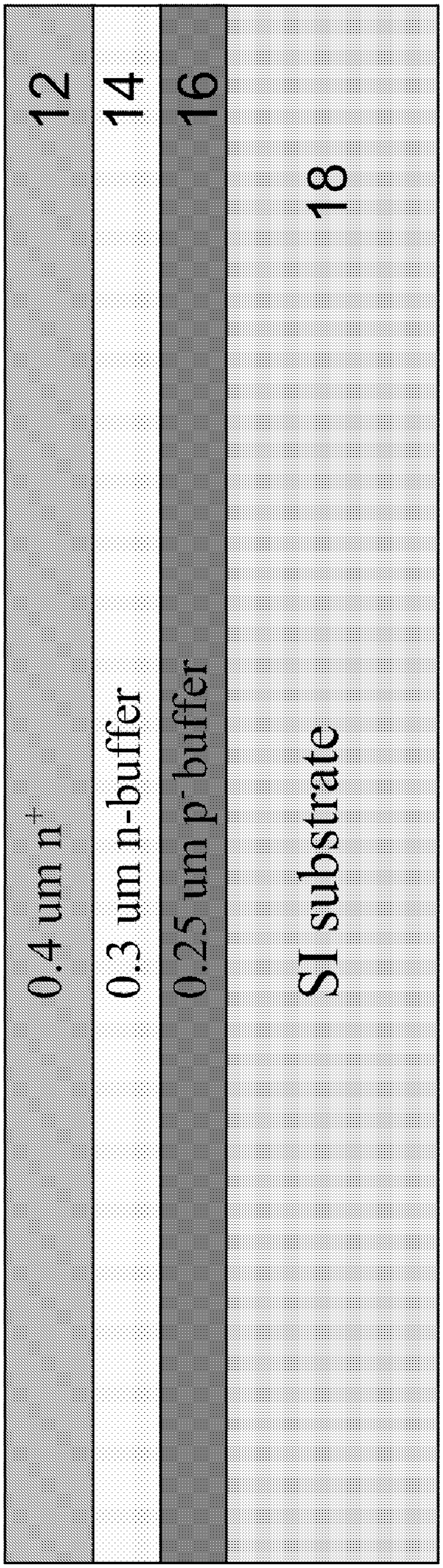
FIGS. 6A-6Q illustrate a method of making a device having selectively regrown gate regions showing schematics of both the top view and the cross-sectional view of the device during various steps in the manufacturing process.
Figure 6B:
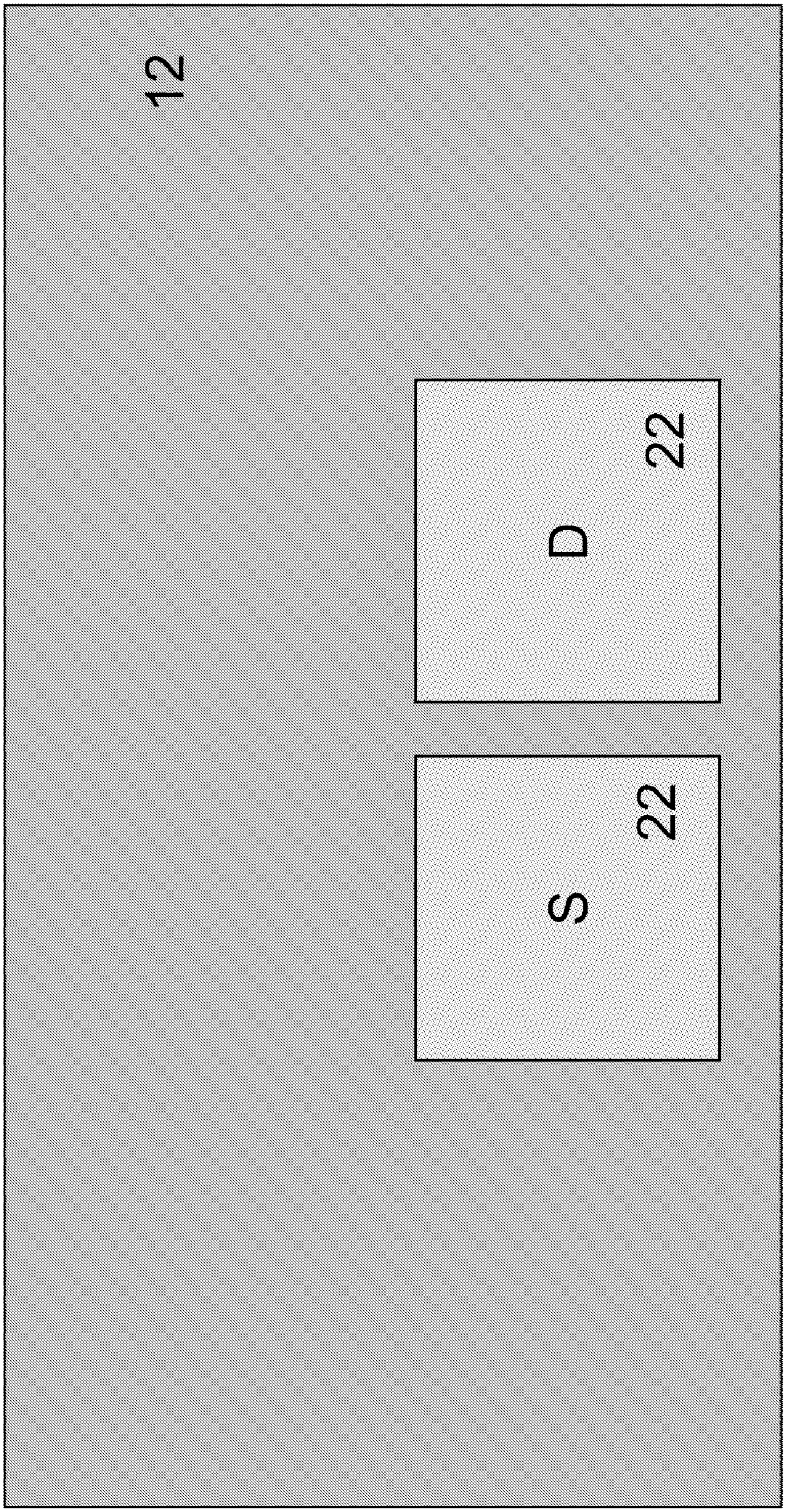
Figure 6C:
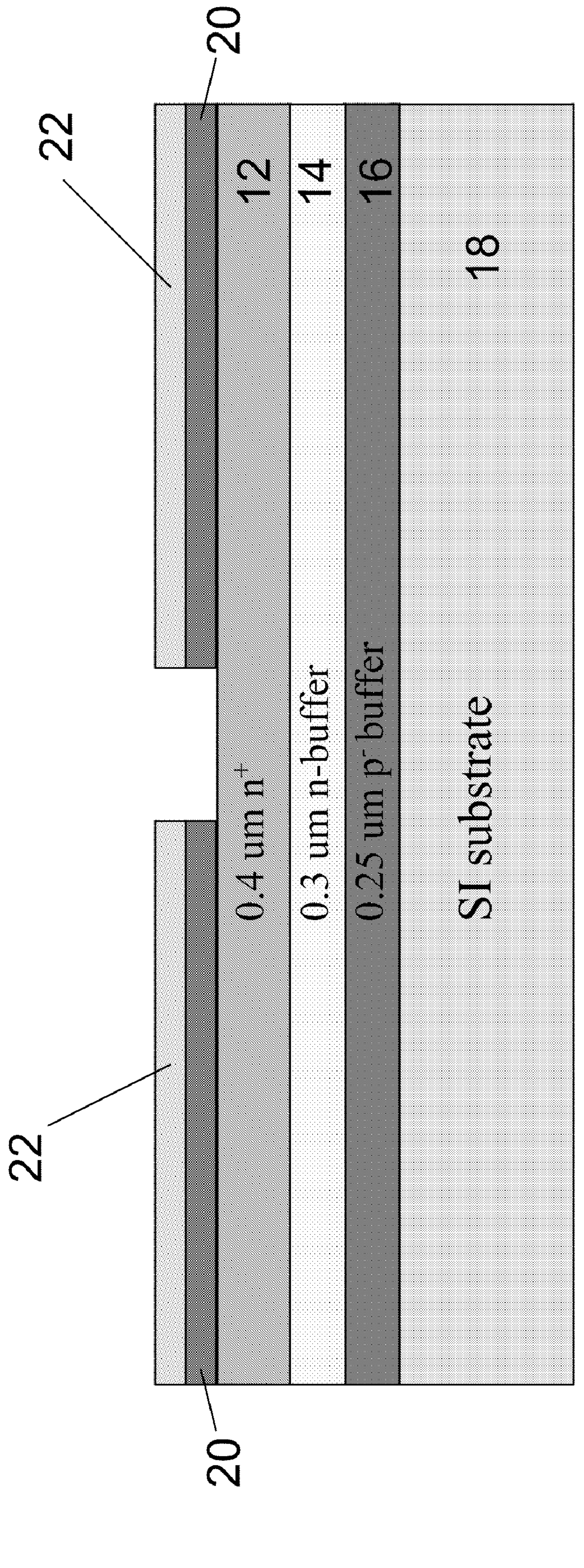
Figure 6D:
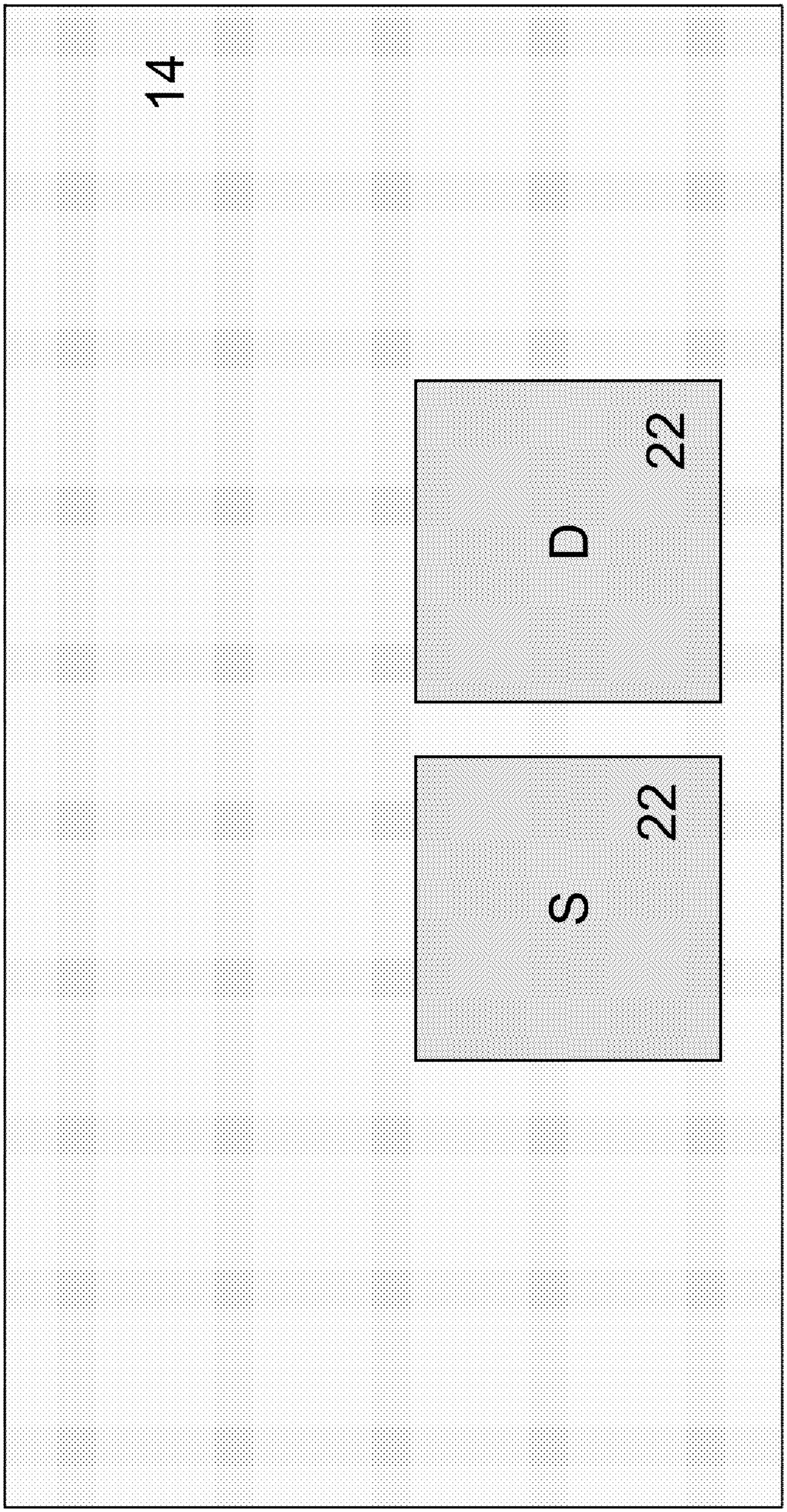
Figure 6E:
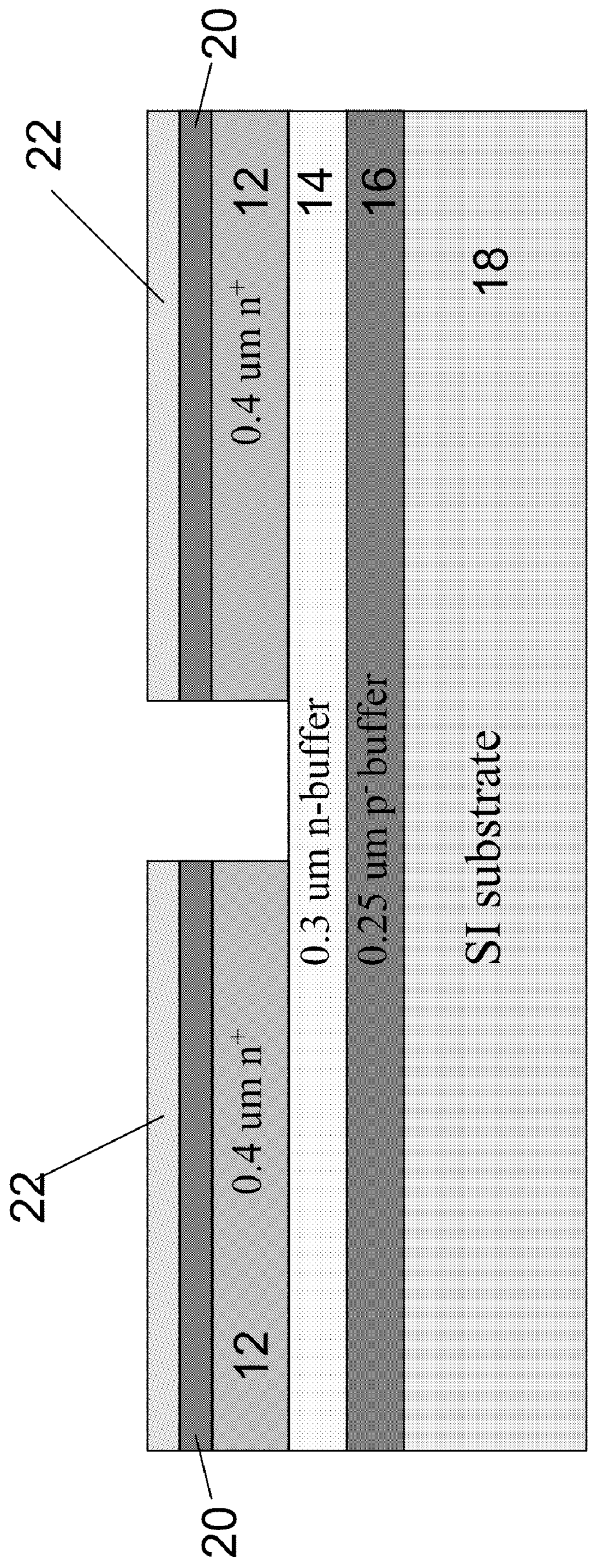
Figure 6F:
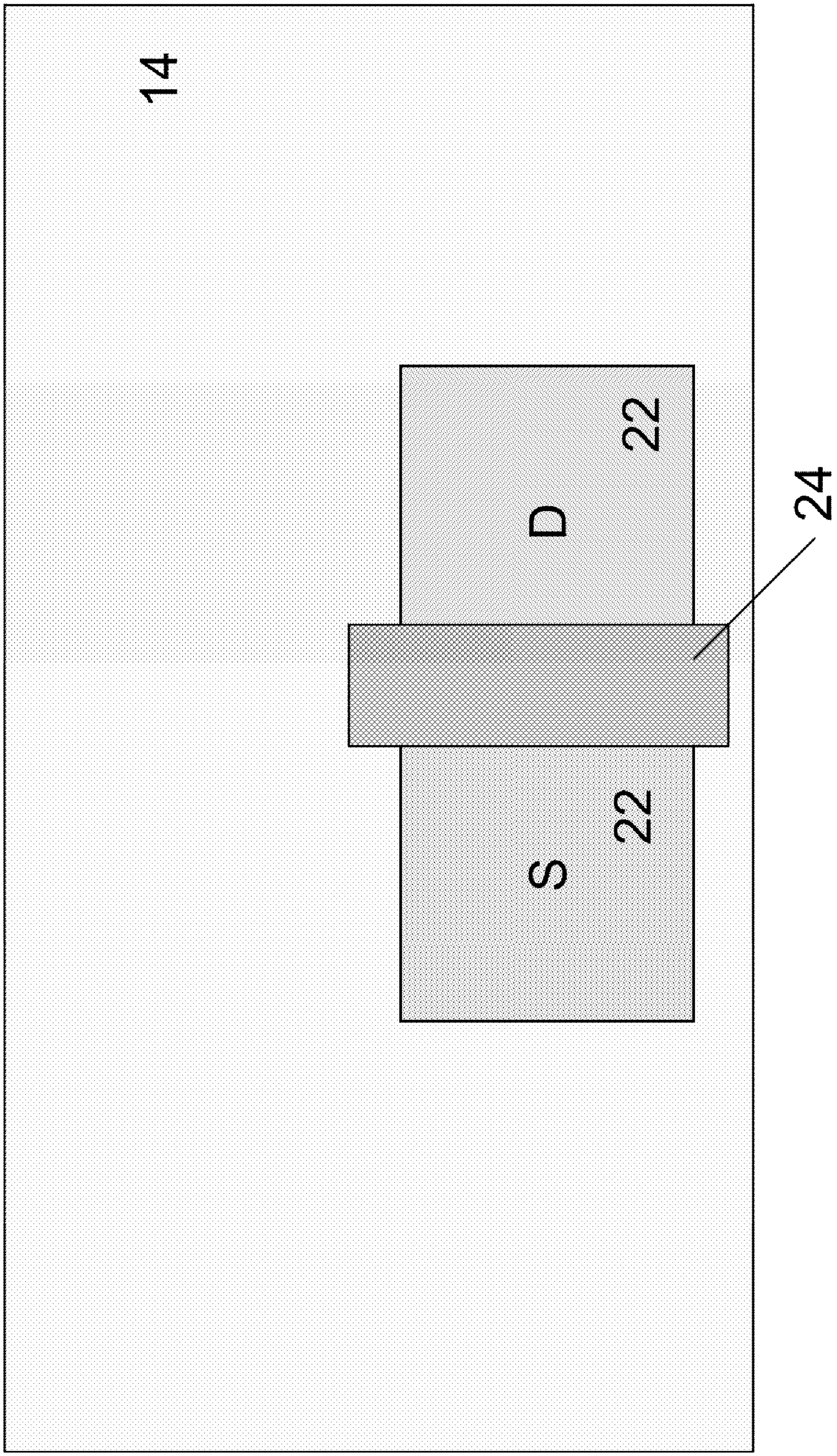
Figure 6G:
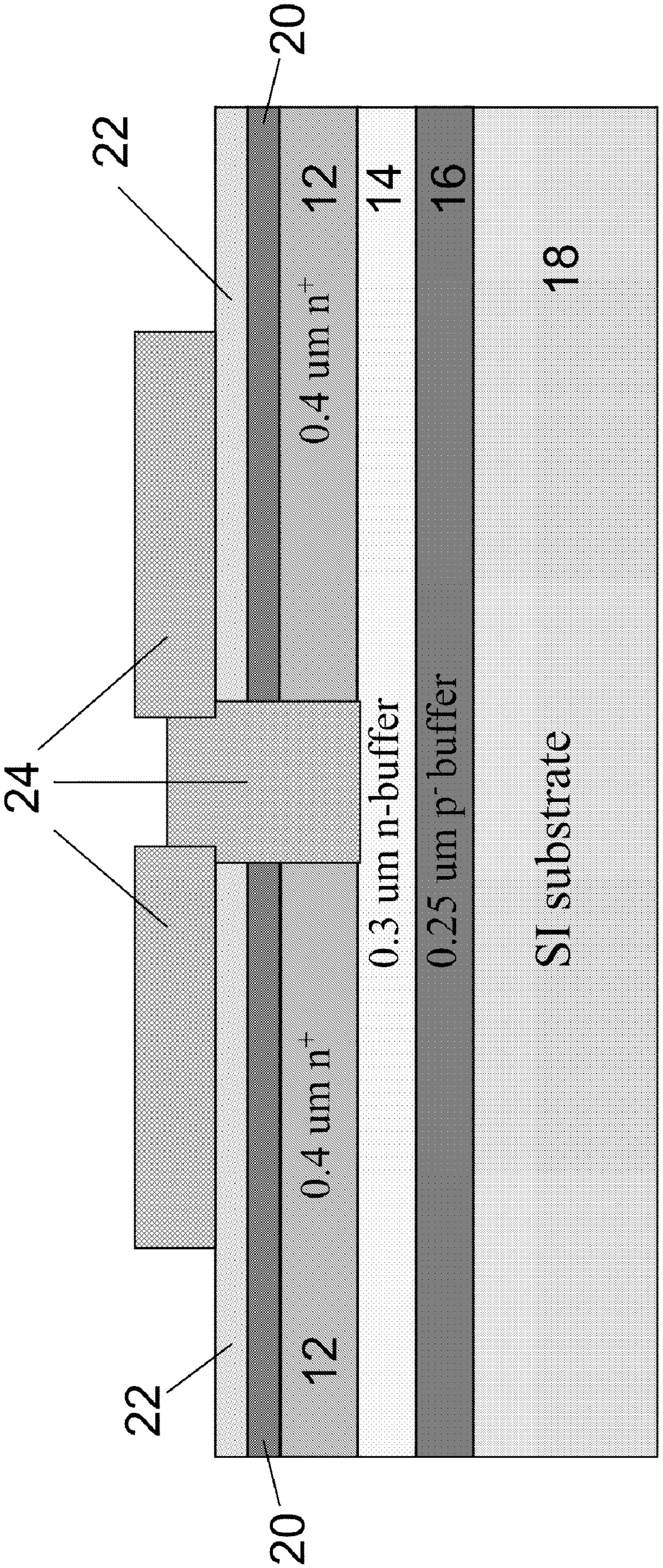
Figure 6H:
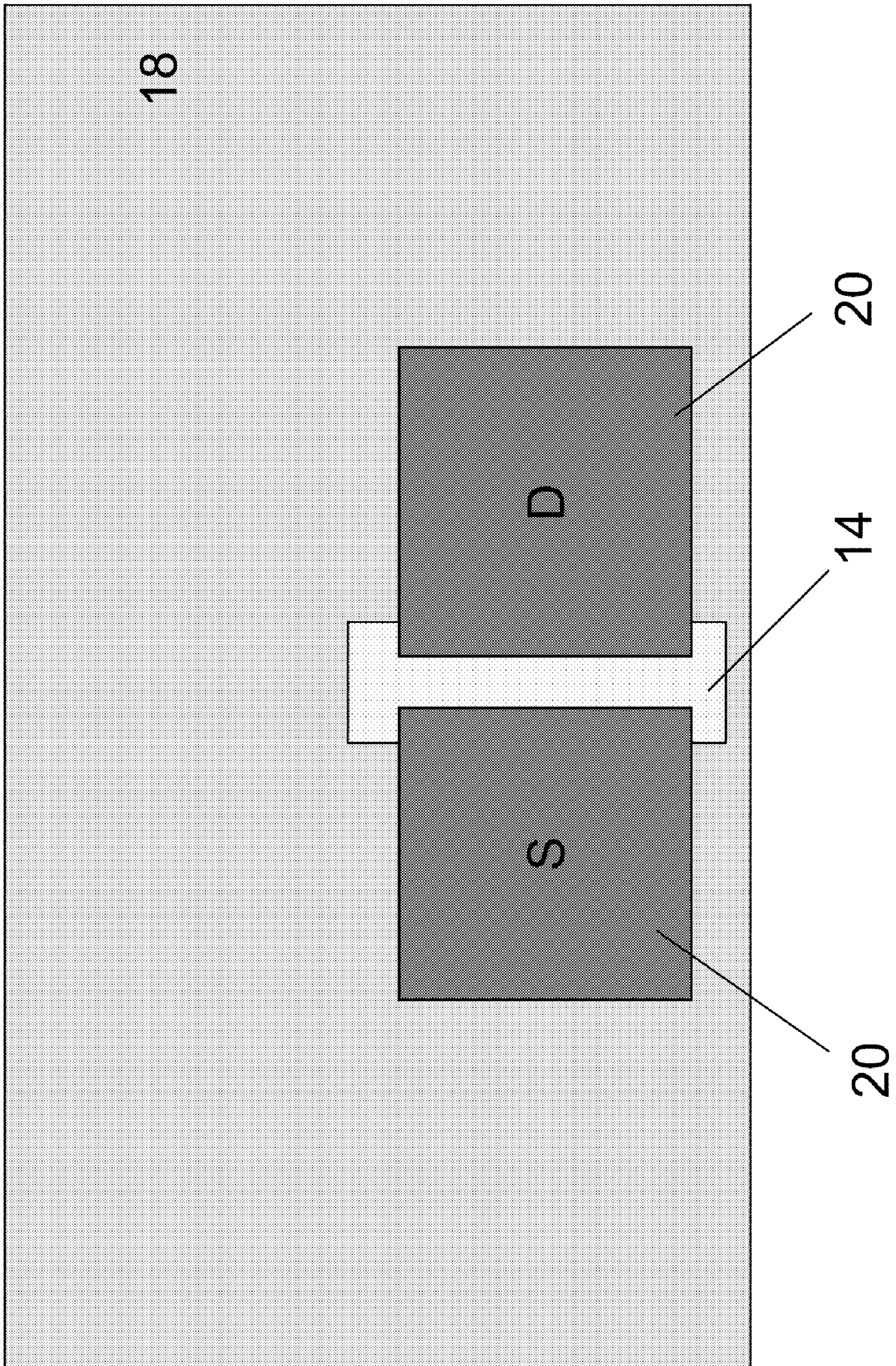
Figure 6I:
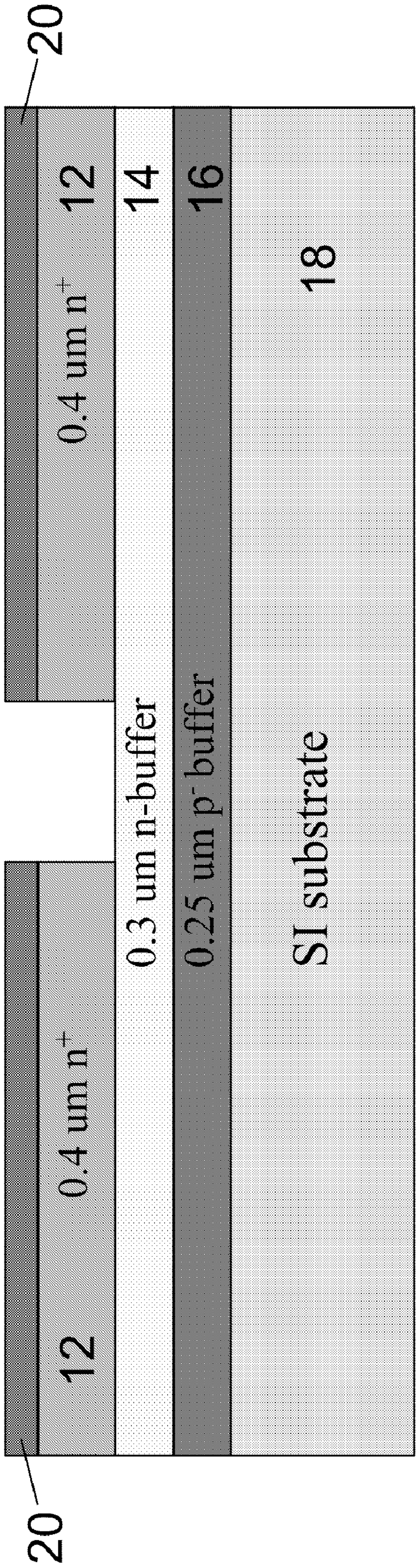
Figure 6J:
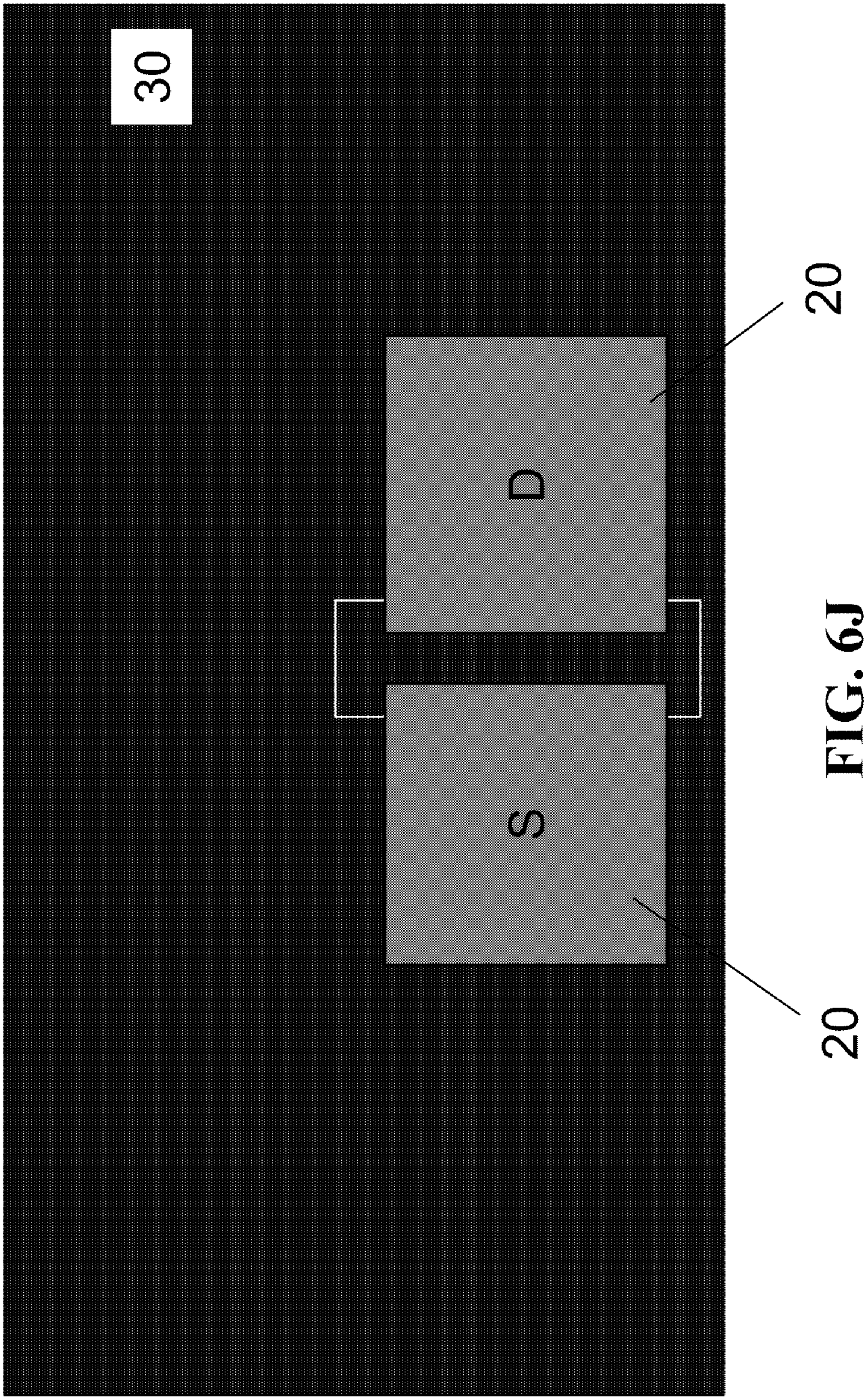
Figure 6K:
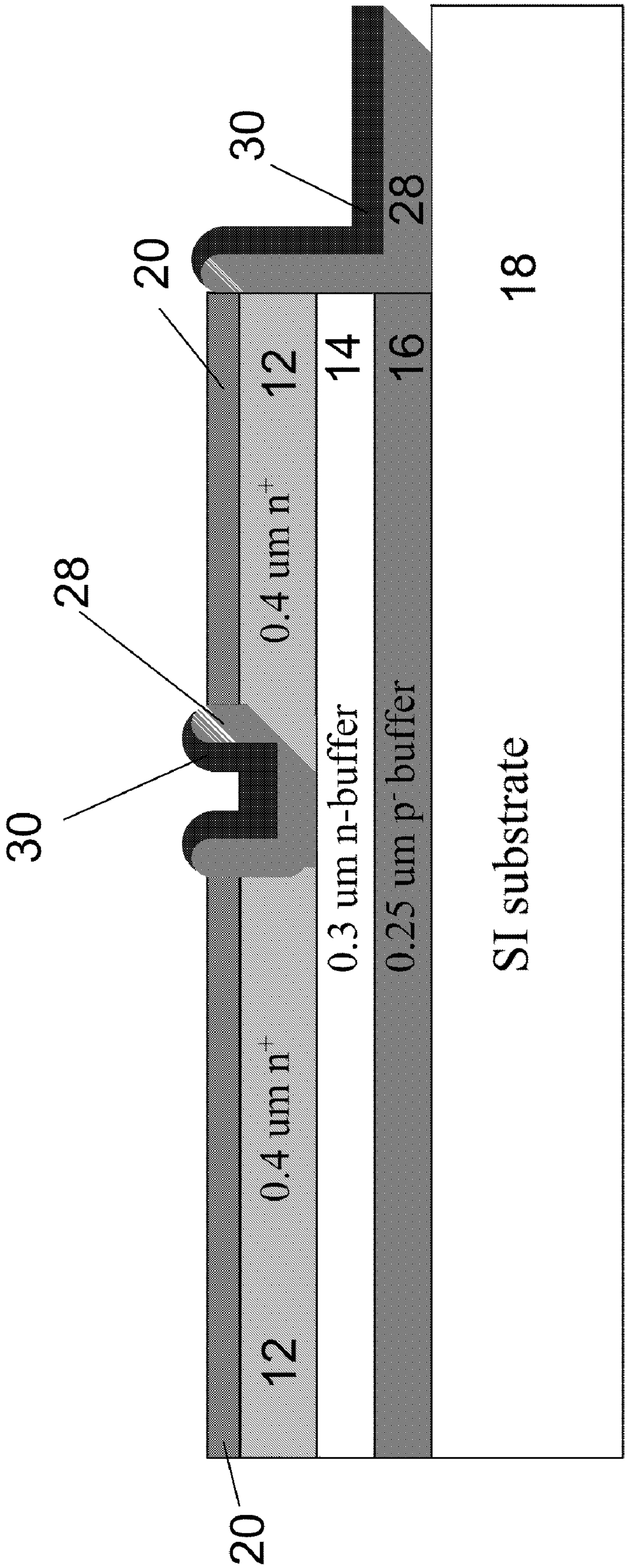
Figure 6L:
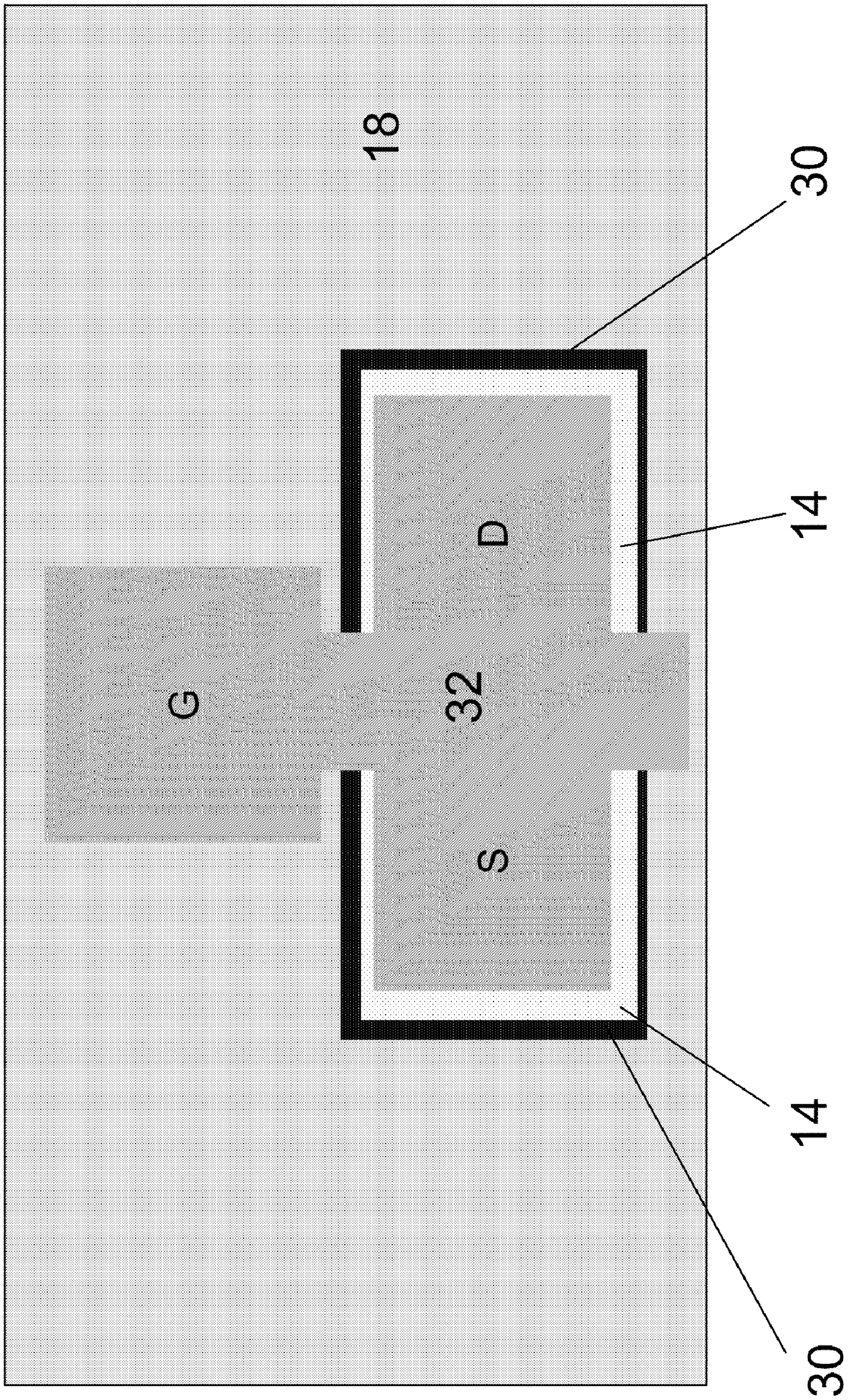
Figure 6M:
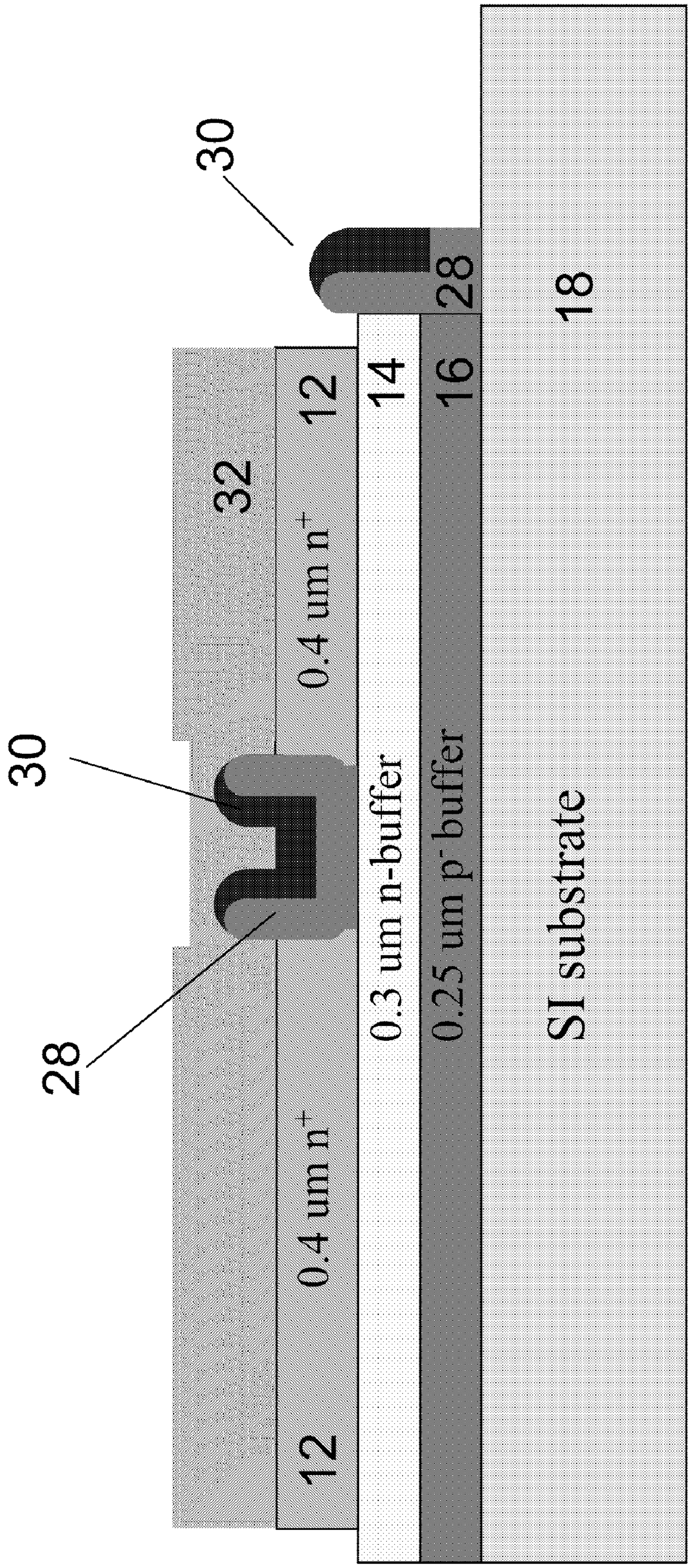
Figure 6N:
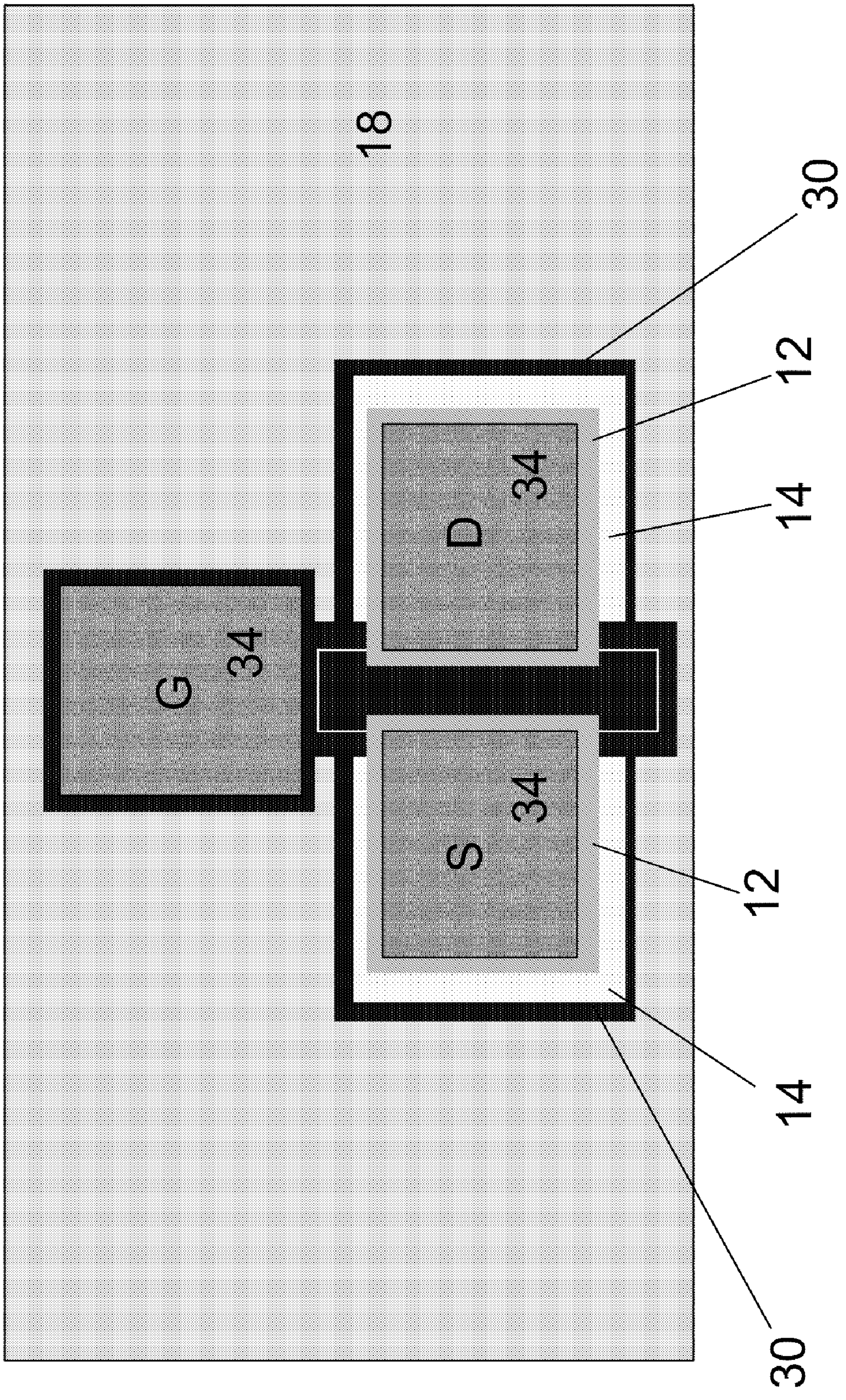
Figure 6O:
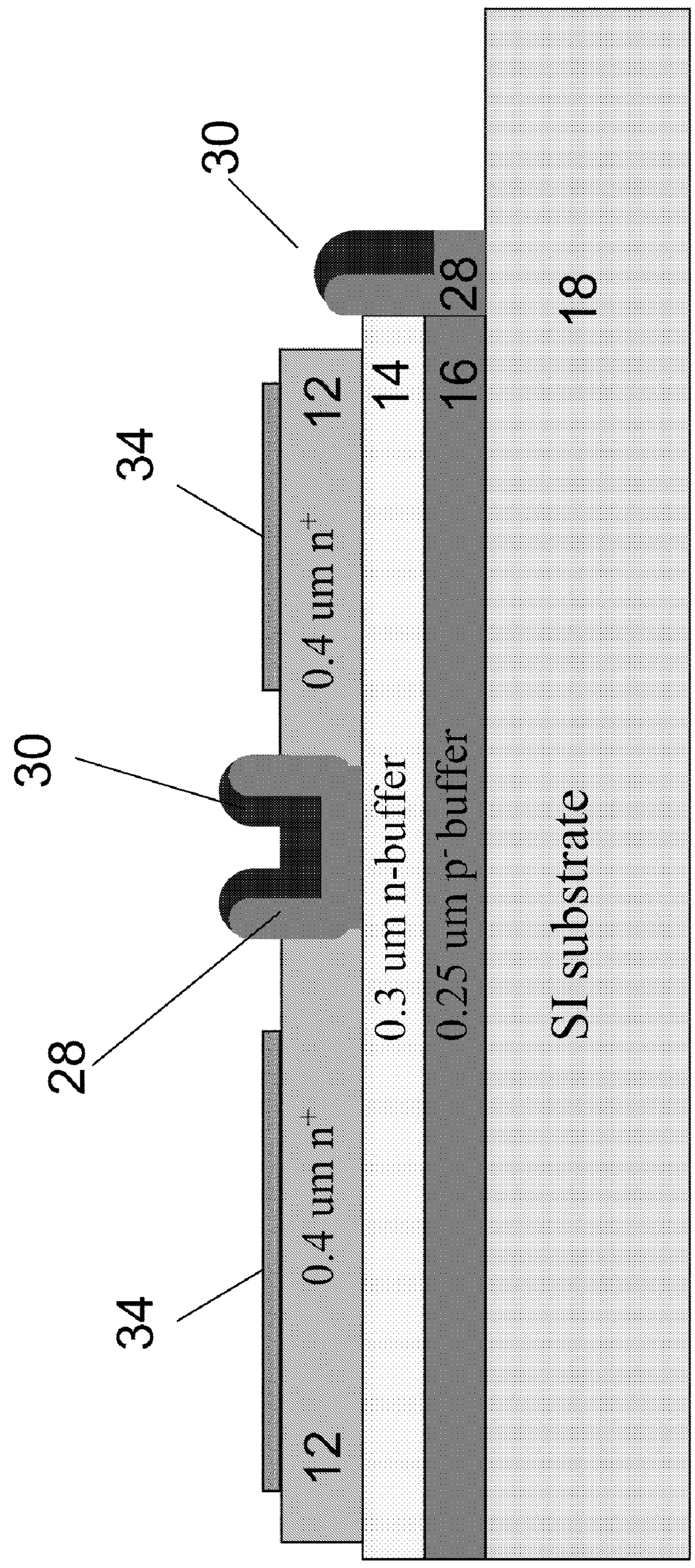
Figure 6P:
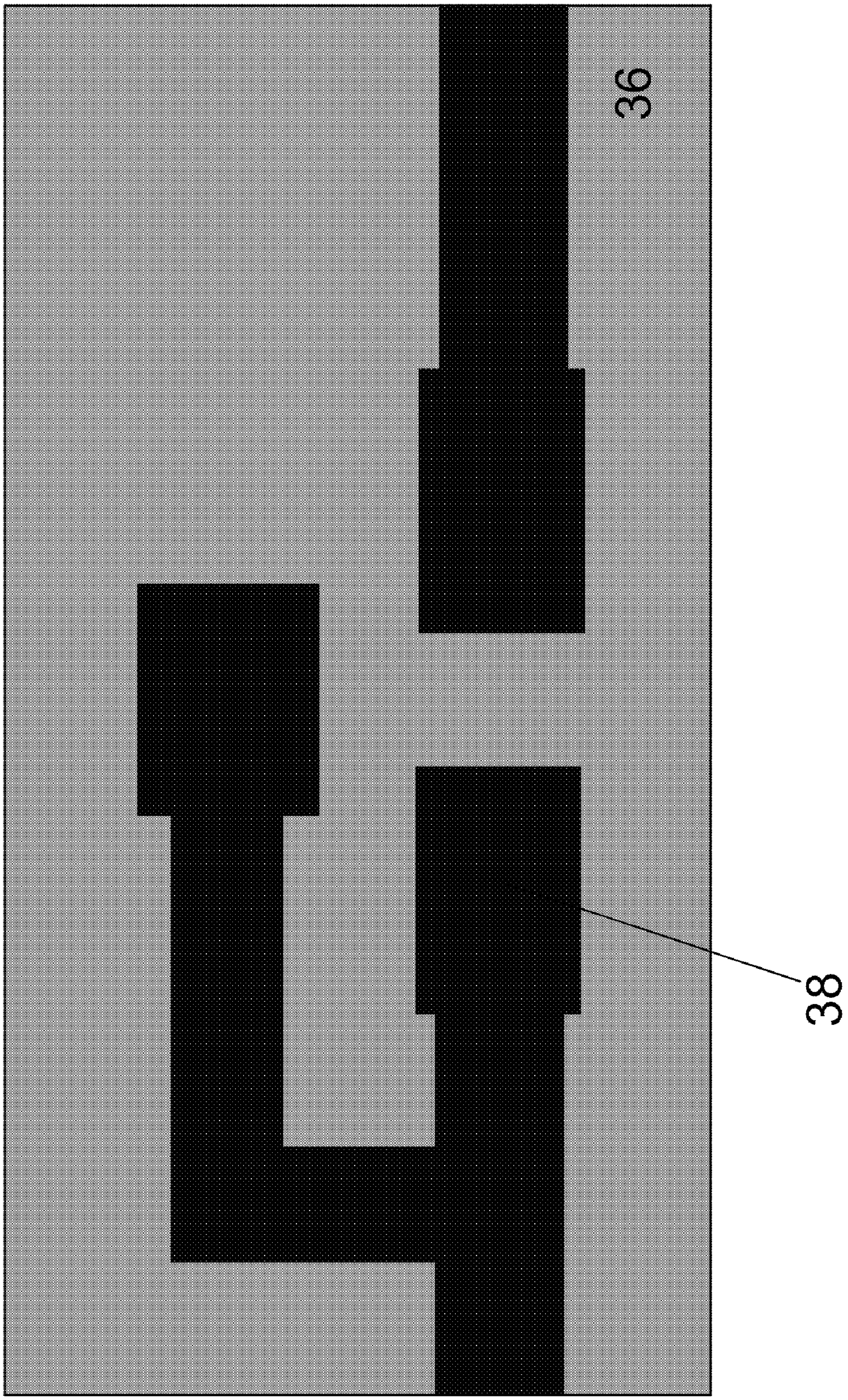
Figure 6Q:
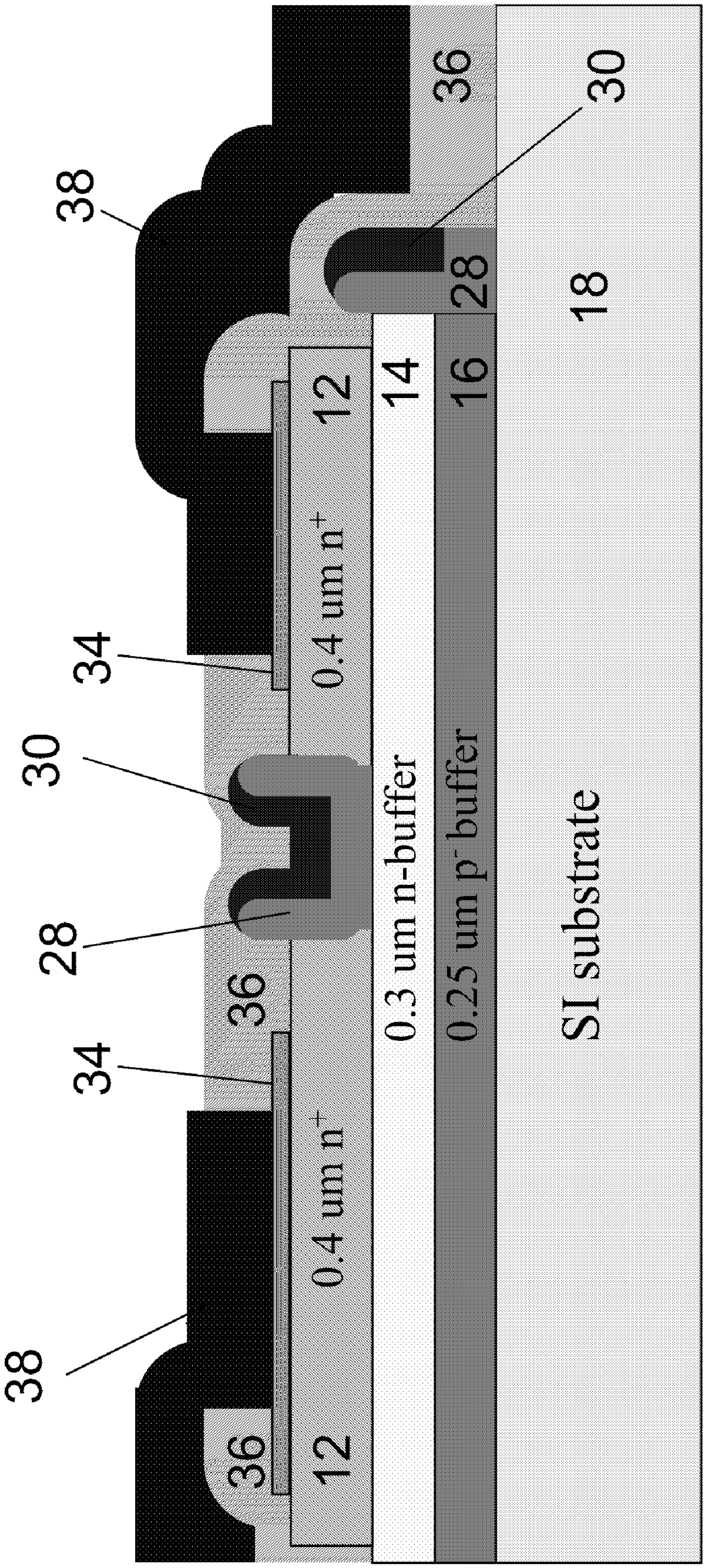

FIGS. 6A-6Q illustrate a method of making a device having selectively regrown gate regions showing both top views and cross-sectional views of the device during various steps in the manufacturing process.

As shown in FIG. 6A, a $p^-$ buffer layer 16, an $n^-$ buffer layer 14 and an $n^+$ cap layer 12 are grown on a substrate 18. The substrate 18 can be a semi-insulating (SI) substrate (e.g., semi-insulating SiC).

The source and gate regions of the device are then patterned with a regrowth mask material 20 and an etch mask material 22 as shown in top-view in FIG. 6B and in cross-section in FIG. 6C. Exemplary regrowth mask materials include, but are not limited to, TaC and C.

Unmasked portions of the device are then etched down to the channel layer as shown in top-view in FIG. 6D and in cross-section in FIG. 6E. The channel of some devices may be etched deeper to make the threshold voltage more positive. Depletion mode devices can be shielded from additional etching by patterning a photoresist (PR) mask on top of them prior to additional etching.

A photoresist (PR) etch mask 24 is then patterned over the active channel region of the device as shown in top-view in FIG. 6F and in cross-section in FIG. 6G.

A field oxide 36 is then deposited, the pad windows etched through the field oxide 36 and the interconnect metal 38 deposited as shown in top-view in FIG. 6P and in cross-section in FIG. 6Q.

FIGS. 7A-7E illustrate a method of making a device having selectively regrown source/drain regions.

Figure 7A:
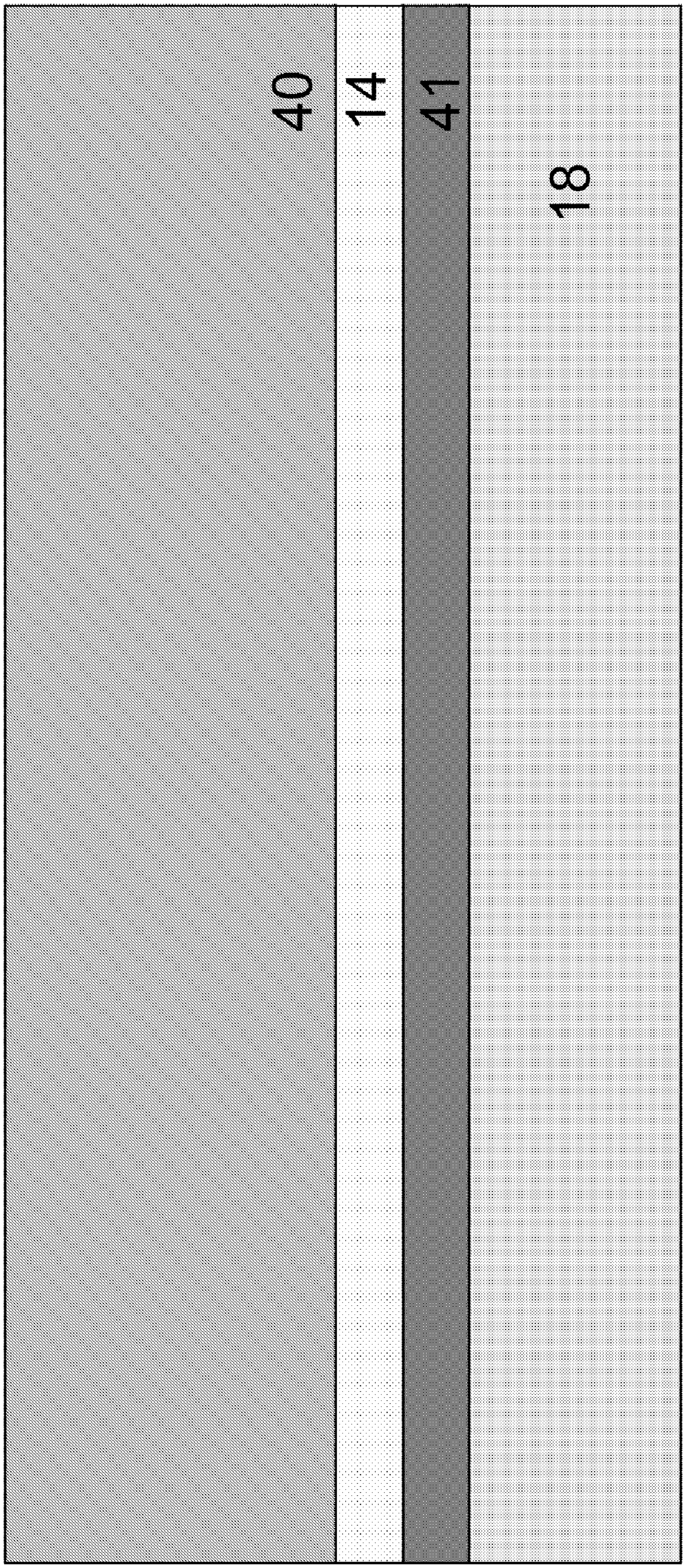
FIGS. 7A-7F illustrate a method of making a device having selectively regrown source/drain regions showing schematic cross-sectional views during various steps in the manufacturing process.
Figure 7B:
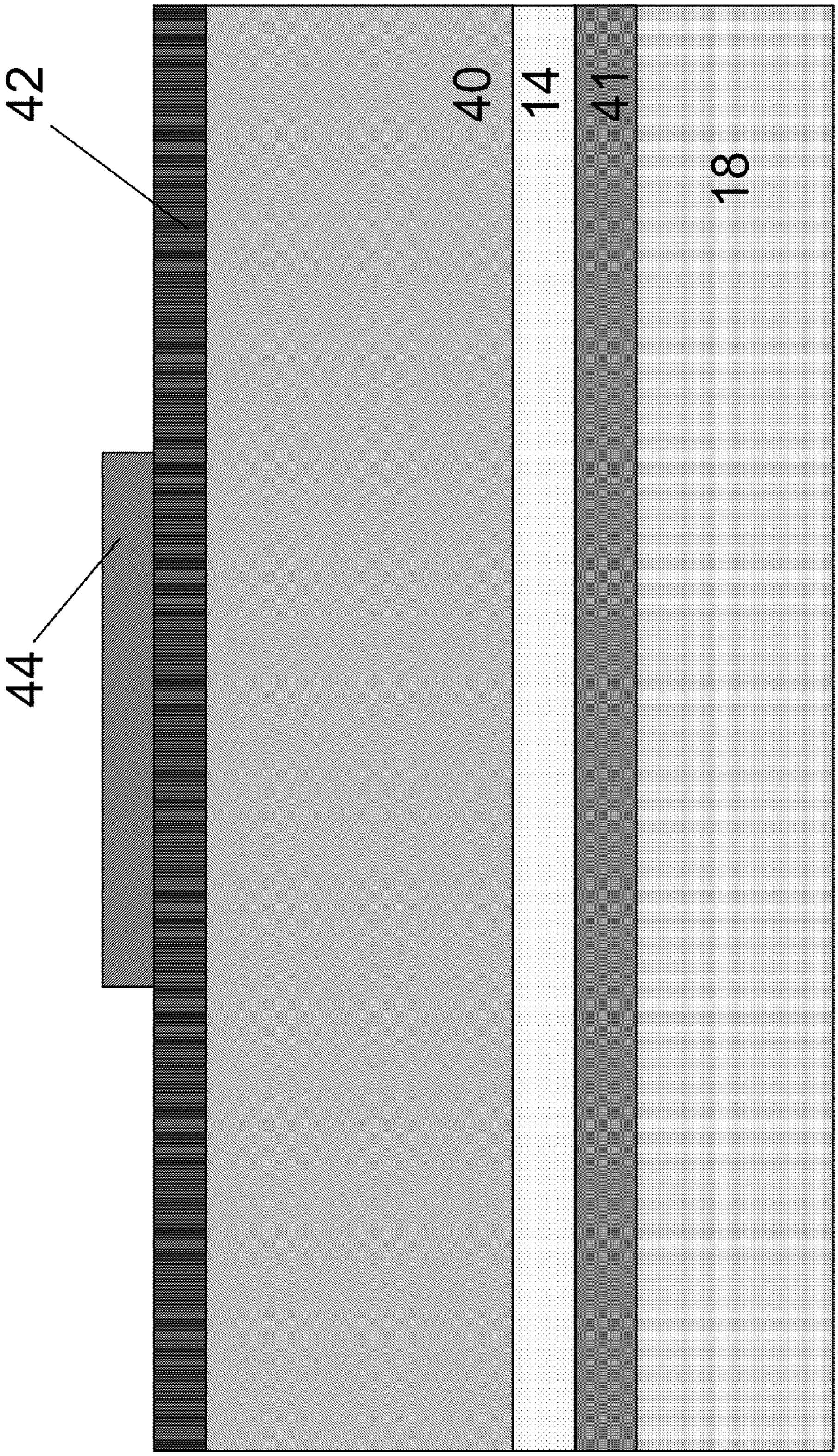
Figure 7C:
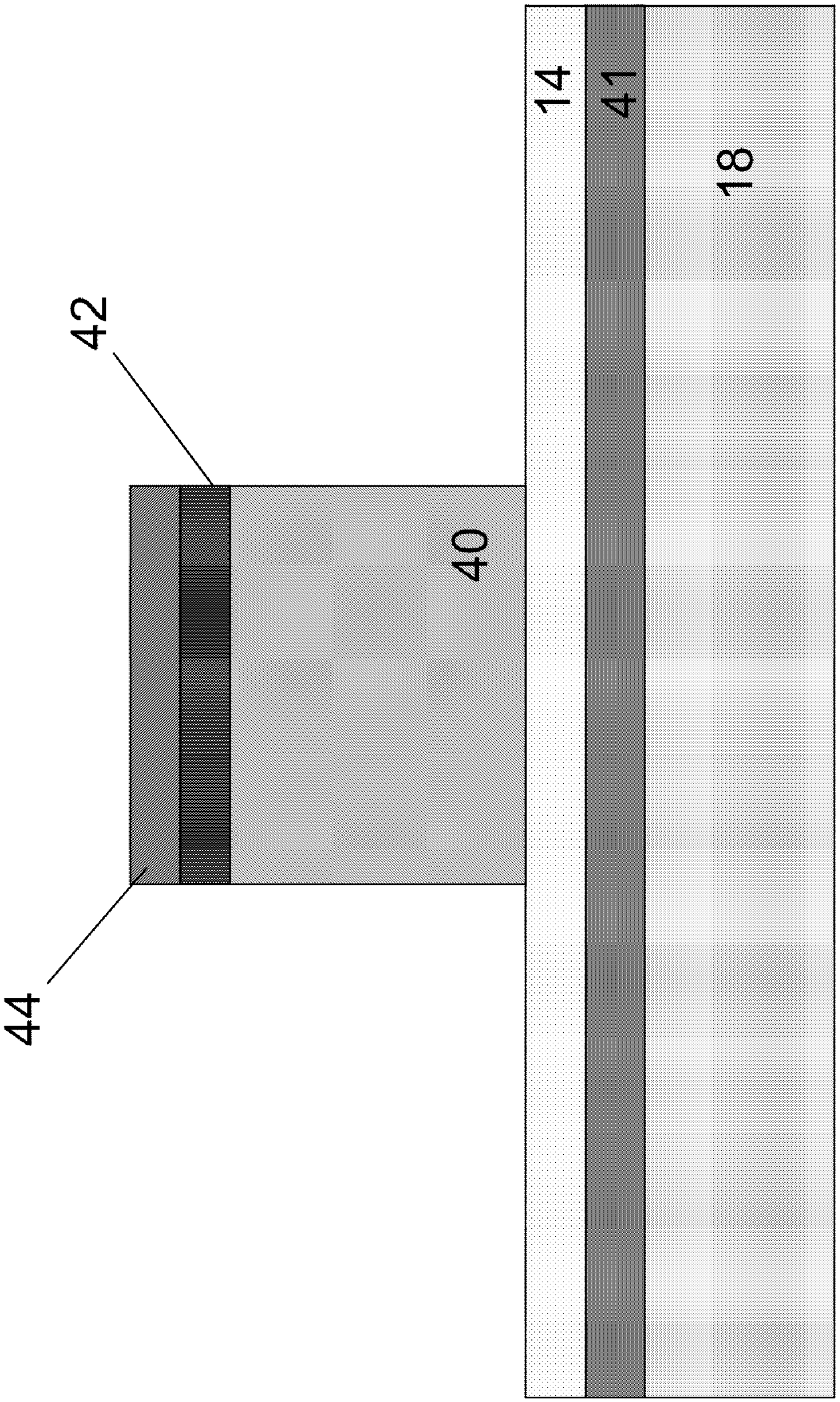
Figure 7D:
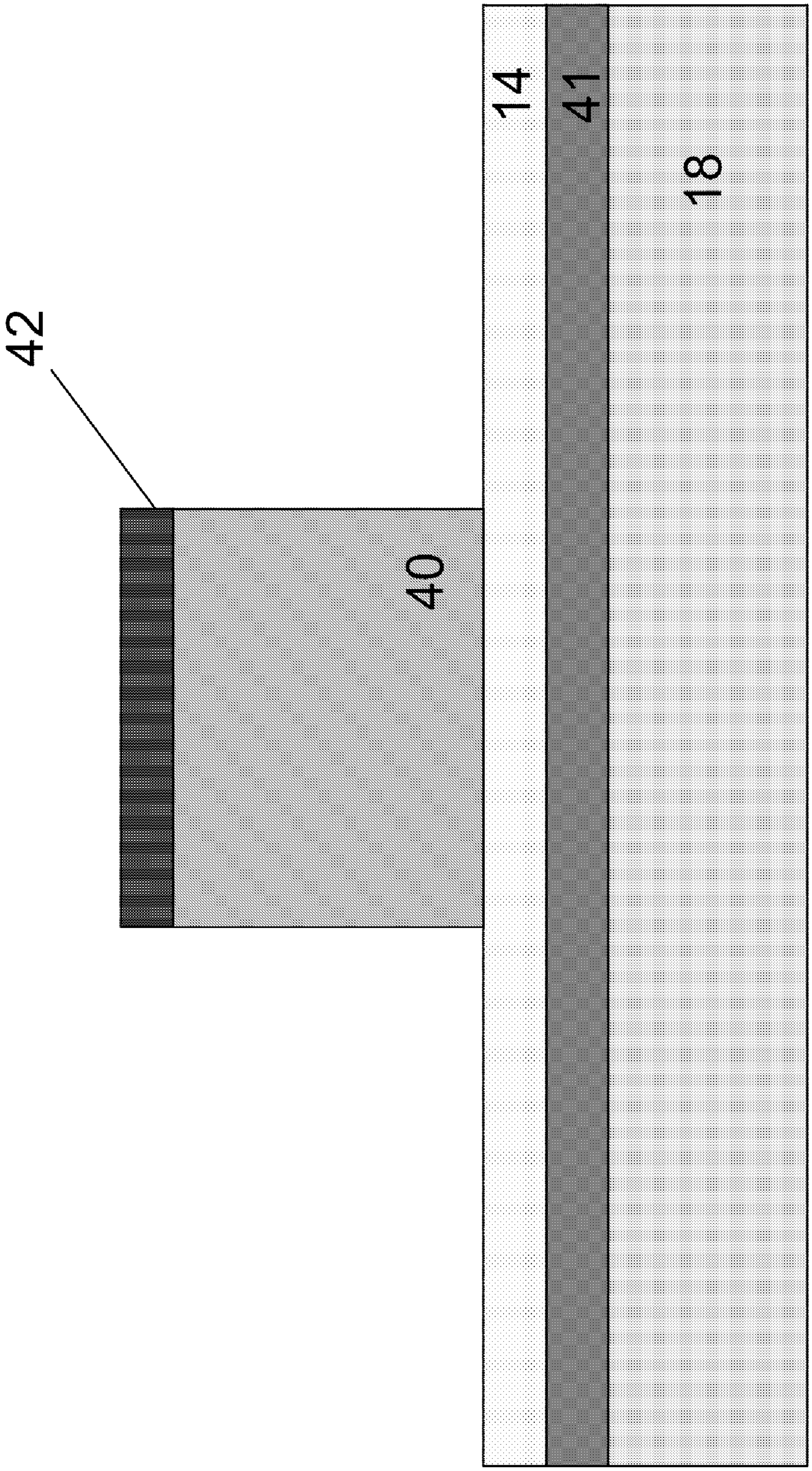
Figure 7E:
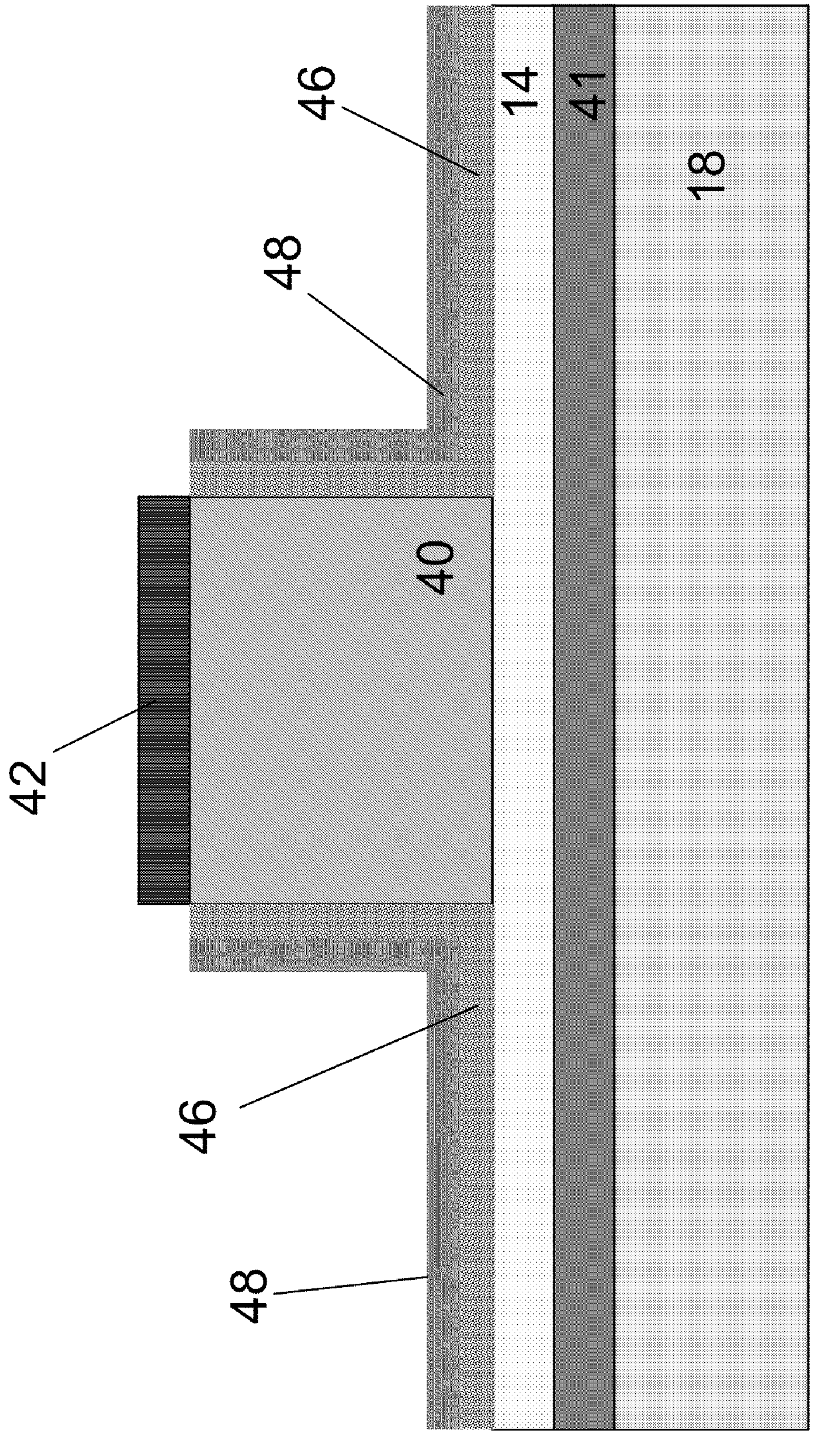
Figure 7F:
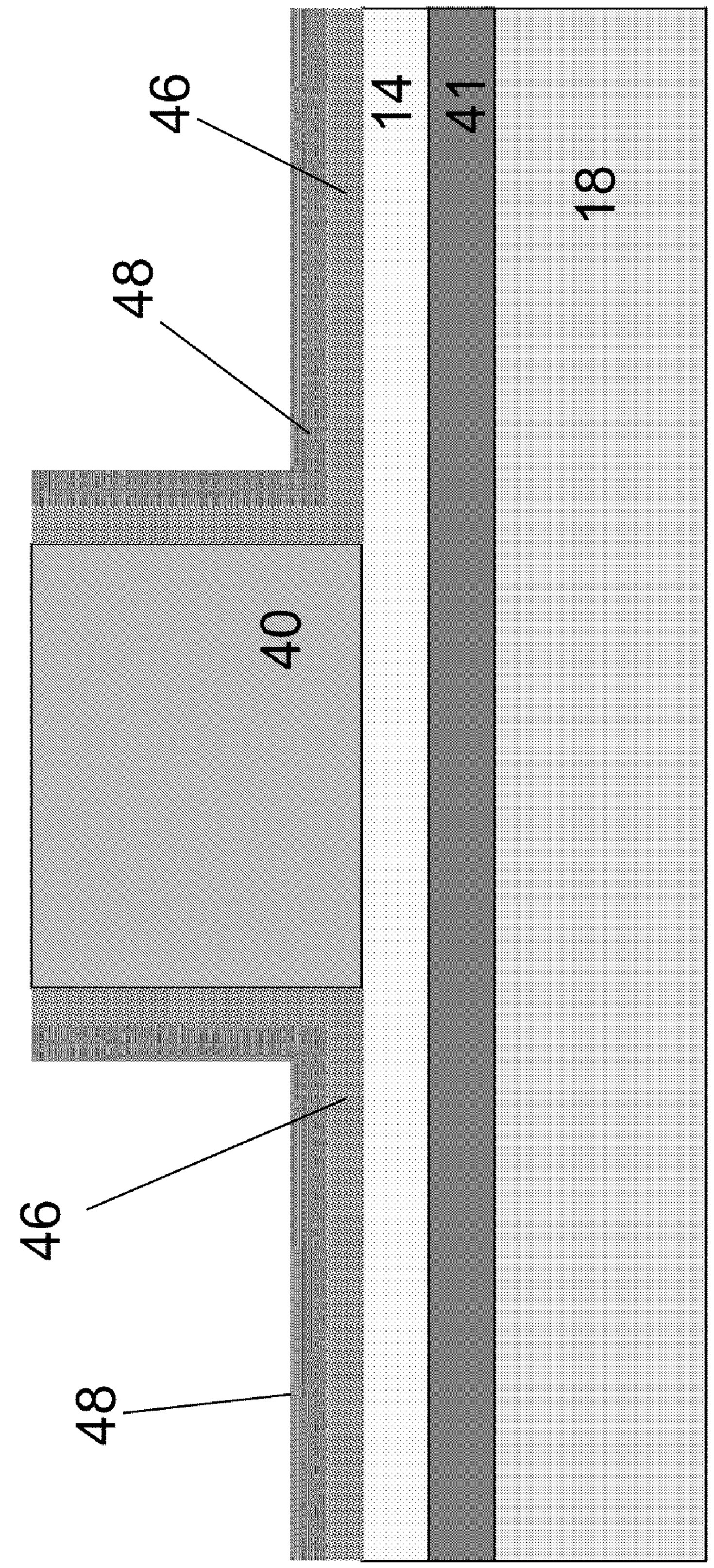

As shown in FIG. 7A, a $p^+$ layer 40 is formed on an $n^-$ layer 14 which is formed on a $p^+$ layer 41 which is formed on a substrate 18. As shown in FIG. 7B, a regrowth mask layer 42 is formed on the $p^+$ layer 40 and a dry etch mask 44 is patterned on the regrowth mask layer 42. The regrowth mask layer 42 and the underlying $p^+$ layer 40 are then etched through to expose the underlying $n^-$ layer 14 as shown in FIG. 7C. The $n^-$ layer 14 forms the channel of the device. The discrete raised $p^+$ region formed by etching through the $p^+$ layer 40 defines the gate of the device. Dry etch mask 44 is then removed as shown in FIG. 7D. An $n^-$ layer 46 and an $n^+$ layer 48 are then regrown over the exposed $n^-$ layer adjacent the $p^+$ region 40 and on the sidewalls of the $p^+$ region 40 as shown in FIG. 7E. The regrowth mask 42 is then removed as shown in FIG. 7F.

Exemplary thicknesses and doping concentrations for various layers of the devices described above are set forth in the following table. The thicknesses and doping concentrations provided below are merely exemplary and are not intended to be limiting.

| Reference Numeral | Layer Description | Exemplary Doping Concentration ($cm^{-3}$) | Exemplary Thickness (μm) |
|---|---|---|---|
| 12 | $n^+$ source/drain | >5 × $10^{18}$ (e.g., 1.5 × $10^{19}$) | 0.1-1.5 (e.g., 0.25 or 0.4) |
| 14 | $n^-$ channel | 1 × $10^{16}$-3 × $10^{17}$ (e.g., 2 × $10^{17}$) | 0.1-1.0 (e.g., 0.2 or 0.3) |
| 16 | $p^-$ buffer | 1 × $10^{16}$-3 × $10^{17}$ (e.g., 2 × $10^{17}$) | 0.1-1.0 (e.g., 0.25) |
| 18 | Substrate | Semi-insulating | 50-450 (e.g., 250) |
| 28 | regrown $p^-$ gate | 1 × $10^{16}$-3 × $10^{17}$ (e.g., 2 × $10^{17}$) | 0.1-1.0 (e.g., 0.2) |
| 30 | regrown $p^+$ gate | >5 × $10^{18}$ (e.g., 1.5 × $10^{19}$) | 0.1-1.0 (e.g., 0.2) |
| 40 | $p^+$ epi layer | >5 × $10^{18}$ (e.g., 1.5 × $10^{19}$) | 0.1-1.5 (e.g., 0.25) |
| 41 | $p^+$ buffer layer | >5 × $10^{18}$ (e.g., 1.5 × $10^{19}$) | 0.1-1.0 (e.g., 0.25) |
| 46 | regrown $n^-$ channel | 1 × $10^{16}$-3 × $10^{17}$ (e.g., 2 × $10^{17}$) | 0.1-1.0 (e.g., 0.25) |
| 48 | regrown $n^+$ channel | >5 × $10^{18}$ (e.g., 1.5 × $10^{19}$) | 0.1-1.0 (e.g., 0.25) |

Unmasked portions of the device are then dry-etched down to the SI substrate and the PR mask and etch mask are stripped as shown in top-view in FIG. 6H and in cross-section in FIG. 6I. The epitaxial regrowth mask 20, however, is left in place.

The $p^-$ epitaxial layer 28 and the $p^+$ epitaxial layer 30 are then regrown as shown in top-view in FIG. 6J and in cross-section in FIG. 6K. As set forth above, devices can also be made by growing only a $p^+$ layer rather than $p^-$ and $p^+$ layers. The $p^-$ layer can be added to enhance maximum source/drain (S/D) to gate (G) breakdown. Ideally, epitaxial material is not grown on the regrowth mask during this step. For SiC devices, however, polyscrystalline SiC may form on the regrowth mask. The poly-SiC can be removed by oxidation (e.g., in a tube furnace) and then wet etching.

The regrowth mask 20 is then stripped, a photoresist mask 32 is patterned covering the gate, gate pad, source, and drain regions of the device and the regrown $p^+$ layer 30 and the regrown $p^-$ layer (if present) are then dry etched through to isolate the devices as shown in top-view in FIG. 6L and in cross-section in FIG. 6M.

The photoresist mask 32 is then stripped and an ohmic metal 34 is patterned and annealed on the gate, source and drain regions of the device as shown in top-view in FIG. 6N and in cross-section in FIG. 6O.

Although SiC semiconductor devices are described above, other semiconductor materials can be used to fabricate the device. For example, the semiconductor material of the device can be any of the wide band-gap semiconductor materials including, but not limited to, SiC, GaN or GaAs.

Silicon carbide crystallizes in numerous (i.e., more than 200) different modifications (polytypes). The most important are: 3C—SiC (cubic unit cell, zincblende); 2H—SiC; 4H—SiC; 6H—SiC (hexagonal unit cell, wurtzile); 15R—SiC (rhombohedral unit cell). The 4H polytype is more attractive for power devices, because of its higher electron mobility. Although 4H—SiC is preferred, it is to be understood that the present invention is applicable to devices and integrated circuits described herein made of other wide bandgap semiconductor materials such as gallium arsenide and gallium nitride, and to other polytypes of silicon carbide, by way of example.

Although devices having a p-type gate are described above and in the drawings, devices having n-type gates can also be made using the methods described above.

The layers of the device can be formed by doping the layers with donor or acceptor materials using known techniques. Exemplary donor materials for SiC include nitrogen and phosphorus. Nitrogen is a preferred donor material for SiC. Exemplary acceptor materials for doping SiC include boron and aluminum. Aluminum is a preferred acceptor material for SiC. The above materials are merely exemplary, however, and any acceptor and donor materials which can be doped into the semiconductor material can be used.

The material used for the regrowth mask can be TaC or C. Other materials can also be used. For example, if a low temperature epitaxial process is employed, $SiO_2$ can be used as a regrowth mask material. The above examples of regrowth mask materials are merely exemplary and are not intended to be limiting. The appropriate regrowth mask material can be selected based on the type of material being regrown and the conditions employed during the regrowth process (e.g., temperature).

The doping levels and thicknesses of the various layers of the devices described herein can be varied to produce a device having desired characteristics for a particular application. Similarly, the dimensions of the various features of the device can also be varied to produce a device having desired characteristics for a particular application.

The layers of the device can be formed by epitaxial growth on a suitable substrate. The layers can be doped during epitaxial growth.

While the foregoing specification teaches the principles of the present invention, with examples provided for the purpose of illustration, it will be appreciated by one skilled in the art from reading this disclosure that various changes in form and detail can be made without departing from the true scope of the invention.

What is claimed is:

1. A method comprising:

selectively etching a layer of regrowth mask material through one or more openings in a first mask to form a discrete raised region of semiconductor material having an upper surface and sidewalls, wherein the layer of regrowth mask material is on a first layer of semiconductor material which is on a second layer of semiconductor material which is on a third layer of semiconductor material which is on a substrate, wherein the second layer of semiconductor material is of a first conductivity type and wherein the first and third layers of semiconductor material are of a second conductivity type different than the first conductivity type, and wherein etching comprises etching through the layer of regrowth mask material and the first layer of semiconductor material to expose underlying second layer of semiconductor material in regions adjacent the first mask;

removing the first mask such that the upper surface of the discrete raised region is covered by the regrowth mask material;

epitaxially growing one or more layers of semiconductor material of the first conductivity type on sidewalls of the discrete raised region and on the second layer of semiconductor material adjacent the discrete raised region; and removing the regrowth mask material from the upper surface of the discrete raised region.

2. The method of claim 1, wherein the semiconductor material of the first conductivity type is an n-type semiconductor material and wherein the semiconductor material of the second conductivity type is a p-type semiconductor material.

3. The method of claim 2, wherein the semiconductor material is a wide bandgap semiconductor material.

4. The method of claim 1, wherein the semiconductor material is SiC.

5. The method of claim 1, wherein epitaxially growing one or more layers of semiconductor material of the first conductivity type comprises epitaxially growing two layers of semiconductor material of the first conductivity type, wherein the first layer has a lower doping concentration than the second layer.

6. The method of claim 1, wherein the regrowth mask material comprises TaC or C.

7. The method of claim 6 wherein the regrowth mask material comprises TaC, the method further comprising:

depositing a layer comprising carbon on the first layer of semiconductor material;

depositing a layer comprising tantalum on the layer comprising carbon; and annealing to form the layer of regrowth mask material.

8. The method of claim 1, wherein the first mask comprises Ti or Ni.

9. The method of claim 1, further comprising:

depositing ohmic metal on the upper surface of the dicrete raised region to form a gate ohmic contact and depositing ohmic metal on the one or more layers of semiconductor material adjacent the discrete raised region to form source and drain ohmic contacts; and annealing the source, drain and gate ohmic contacts.

10. The method of claim 9, wherein the ohmic metal is Ni.

11. The method of claim 9, further comprising depositing an electrically conductive metal layer in contact with the source, gate and drain ohmic contacts.

12. A semiconductor device made by the method of claim 1.

13. A method comprising:

selectively etching a first layer of semiconductor material through one or more openings in a first mask to form first and second discrete raised regions of semiconductor material having upper surfaces covered by the first mask, wherein the first layer of semiconductor material is on a second layer of semiconductor material which is on a third layer of semiconductor material which is on a semiconductor substrate, wherein the first and second layers of semiconductor material are of a first conductivity type, wherein the third layer of semiconductor material is of a second conductivity type different than the first conductivity type, wherein etching exposes the second layer of semiconductor material in regions adjacent and between the first and second discrete raised regions, and wherein the first mask comprises a layer of regrowth mask material on the first semiconductor layer and a layer of etch mask material on the layer of regrowth mask material, depositing a second mask over the second layer of semiconductor material in an area between the first and second discrete raised regions;

etching through the second layer of semiconductor material and the third layer of semiconductor material to expose the substrate in areas adjacent the first and second masks;

removing the second mask such that the area between the discrete raised regions is exposed;

removing the layer of etch mask material such that the upper surfaces of the discrete raised regions are covered by the regrowth mask material;

epitaxially growing one or more layers of semiconductor material of the second conductivity type on the area between the first and second discrete raised regions and on the substrate adjacent the first and second discrete raised regions;

removing the regrowth mask material;

depositing a third mask over the first and second discrete raised regions, over the area between the first and second discrete raised regions and on a gate region of the one or more layers of semiconductor material of the second conductivity type adjacent the first and second discrete raised regions;

etching through the one or more layers of semiconductor material of the second conductivity type in areas adjacent the third mask; and removing the third mask.

14. The method of claim 13, wherein the first layer of semiconductor material has a higher doping concentration than the second layer of semiconductor material.

15. The method of claim 13, wherein the semiconductor material of the first conductivity type is an n-type semiconductor material and wherein the semiconductor material of the second conductivity type is a p-type semiconductor material.

16. The method of claim 13, wherein the semiconductor material is a wide bandgap semiconductor material.

17. The method of claim 13, wherein the substrate is a semi-insulating substrate.

18. The method of claim 13, wherein the semiconductor material is SiC.

19. The method of claim 13, wherein the second mask is a photoresist mask.

20. The method of claim 13, wherein the third mask is a photoresist mask.

21. The method of claim 13, further comprising:

depositing ohmic metal on the first and second discrete areas to form source and drain ohmic contacts and on the gate region of the one or more layers of p-type semiconductor to form a gate ohmic contact; and annealing the source, drain and gate ohmic contacts.

22. The method of claim 21, further comprising depositing an electrically conductive metal layer in contact with the source, gate and drain ohmic contacts.

23. The method of claim 21, wherein the ohmic metal is Ni.

24. The method of claim 13, wherein epitaxially growing one or more layers of semiconductor material of the second conductivity type comprises epitaxially growing two layers of semiconductor material of the second conductivity type, wherein the first layer has a lower doping concentration than the second layer.

25. The method of claim 13, wherein the regrowth mask material comprises TaC or C.

26. The method of claim 25 wherein the regrowth mask material comprises TaC, the method further comprising:

depositing a layer comprising carbon on the first layer of semiconductor material;

depositing a layer comprising tantalum on the layer comprising carbon; and annealing to form the layer of regrowth mask material.

27. The method of claim 13, wherein the first mask comprises Ti or Ni.

28. The method of claim 13, wherein etching through the first layer of semiconductor material to expose underlying second layer of semiconductor material further comprises etching partially into the second layer of semiconductor material.

29. A device mad by the method of claim 13.

* * * * *

UNITED STATES PATENT AND TRADEMARK OFFICE

CERTIFICATE OF CORRECTION

PATENT NO. : 7,560,325 B1
APPLICATION NO. : 12/102382
DATED : July 14, 2009
INVENTOR(S) : Joseph Neil Merrett et al.

It is certified that error appears in the above-identified patent and that said Letters Patent is hereby corrected as shown below:

On the Title page, item [73], the address of the assignee which appears as "Starkville, MI (US)" should instead read --Starkville, MS (US)--

Signed and Sealed this

Twentieth Day of July, 2010

David J. Kappos

David J. Kappos
*Director of the United States Patent and Trademark Office*